US008361548B2

(12) United States Patent
Moffat et al.

(10) Patent No.: US 8,361,548 B2
(45) Date of Patent: Jan. 29, 2013

(54) METHOD FOR EFFICIENT COATING OF SUBSTRATES INCLUDING PLASMA CLEANING AND DEHYDRATION

(75) Inventors: William A. Moffat, San Jose, CA (US); Kenneth M. Sautter, Sunnyvale, CA (US)

(73) Assignee: Yield Engineering Systems, Inc., Livermore, CA (US)

( * ) Notice: Subject to any disclaimer, the term of this patent is extended or adjusted under 35 U.S.C. 154(b) by 580 days.

(21) Appl. No.: 12/229,307

(22) Filed: Aug. 20, 2008

(65) Prior Publication Data

US 2010/0203260 A1 Aug. 12, 2010

Related U.S. Application Data

(63) Continuation-in-part of application No. 11/148,543, filed on Jun. 8, 2005, which is a continuation-in-part of application No. 10/656,840, filed on Sep. 5, 2003, now Pat. No. 7,727,588.

(51) Int. Cl.
*C23C 16/44* (2006.01)
*B05D 3/10* (2006.01)

(52) U.S. Cl. ..................... 427/248.1; 427/299; 427/314; 427/255.28

(58) Field of Classification Search ........................ None
See application file for complete search history.

(56) References Cited

U.S. PATENT DOCUMENTS

| | | | | |
|---|---|---|---|---|
| 4,751,170 | A * | 6/1988 | Mimura et al. | 430/296 |
| 7,045,170 | B1 * | 5/2006 | Hankins et al. | 427/255.18 |
| 2002/0017315 | A1 * | 2/2002 | Kamikawa et al. | 134/61 |
| 2002/0031618 | A1 * | 3/2002 | Sherman | 427/569 |
| 2003/0161949 | A1 * | 8/2003 | Ashurst et al. | 427/248.1 |
| 2003/0183245 | A1 * | 10/2003 | Sheu | 134/1.2 |

OTHER PUBLICATIONS

Sakata, Transducers, p. 1-4, 1999.*
Ashurst, Sensors and Actuators A, 104, p. 213-221, Apr. 2003.*
Mayer, J. Vac. Sci. Tech. B, 18(5), p. 2433, Sep./Oct. 2000.*
Water Phase Diagram (evidentiary).*
Office Action, case U.S. Appl. No. 11/148,543, Jan. 15, 2009, evidentiary.*
Water Phase Diagram (evidentiary)—downloaded Oct. 2011.*

* cited by examiner

*Primary Examiner* — Joseph Miller, Jr.
(74) *Attorney, Agent, or Firm* — Michael A. Guth

(57) ABSTRACT

A process for the coating of substrates comprising insertion of a substrate into a process oven, plasma cleaning of the substrate, rehydration of the substrate, dehydration of the substrate, withdrawal of a metered amount of one or more chemicals from one or more chemical reservoirs, vaporizing the withdrawn chemicals in one or more vapor chambers, and transfer of the vaporized chemicals into a process oven, thereby reacting with the substrate. An apparatus for the coating of substrates comprising a process oven, a gas plasma generator, a metered chemical withdrawal subsystem, and a vaporization subsystem.

9 Claims, 23 Drawing Sheets

METHOD FOR EFFICIENT COATING OF SUBSTRATES INCLUDING PLASMA CLEANING AND DEHYDRATION

CROSS-REFERENCE TO RELATED APPLICATIONS

This application is a continuation in part of U.S. patent application Ser. No. 11/148,543, filed Jun. 8, 2005, which is a continuation in part of U.S. patent application Ser. No. 10/656,840 to Moffat et al., filed Sep. 5, 2003 now U.S. No. 7727588.

BACKGROUND

1. Field of the Invention

This invention relates to the coating of substrates, and in particular to a process for the efficient coating of substrates using chemical vapor reaction and gas plasma cleaning.

2. Description of the Related Art

The application of coatings onto substrates and other workpieces is required as a process step in many industrial fields. An example of such a process is the coating of a silicon wafer with a layer of Hexamethyldisalizane (HMDS). This coating process is used to promote the adhesion of organic layers such as photoresist to the inorganic silicon wafer. The HMDS molecule has the ability to adhere to the silicon wafer and also to be adhered to by an organic additional layer. For example, silicon wafers would be baked for 30 minutes in a 150 C. oven for 30 minutes to dehydrate them. The silicon wafers would then be sprayed with HMDS. The excess HMDS would then be spun off of the silicon wafer. A typical process of this type would result in a HMDS monolayer on the surface of the silicon wafer.

A problem encountered with the above mentioned process was that if the silicon wafer was not sufficiently dry and not sufficiently clean prior to the application of HMDS, then residual moisture would interfere with the reaction of the HMDS to the silicon wafer. This would result in variations in the HMDS layer reaction and then could lead to voids in the subsequently applied next layer. Another problem with a process of this type is that HMDS would rapidly deteriorate when exposed to air and moisture, and thus such a process required a large amount of HMDS to provide a small amount of reaction.

The coating of substrates for biotech, semiconductor, and other applications may require sufficiently clean and dehydrated substrates and insertion into the process chamber of one or more deposition chemicals which have been preheated and/or vaporized prior to insertion. Biotech applications may require silane deposition onto glass and/or other substrates as a bridge to organic molecules. Among the silanes used are amino silanes, epoxy silanes, and mercapto silanes. These silanes are used in the adhesion layer between glass substrates and oligonucleotides. Oligonucleotides are a short DNA monomer. Substrates are coated with a monolayer of silane as a bridge between the inorganic substrate and the organic oligonucleotide. A silane coated substrate with an oligonucleotide layer is now a standard tool used in biotech test regimens. One area where this oligonucleotide layer is used is in the formation of DNA microarrays. A uniform and consistent silane layer leads to a more uniform and consistent top surface of the oligonucleotide layer, which in turn leads to more useful test results.

When silanes are used as boundary layers, and in other applications, a consistent defect free layer becomes very important. In order to minimize defects, the substrates may need to be cleaned very thoroughly. Also, residual moisture may need to be removed from the substrate prior to the reaction of a silane with the surface. However, it may be very desirable to have embedded hydroxyl ions in the surface in some processes to provide an anchor for a reacted compound.

What is called for is a process which cleans a substrate, allows for rehydration of the substrate to restore an anchor layer to the substrate, and also sufficiently dehydrates the substrate to remove residual moisture. What is also called for is an apparatus which is able to plasma clean substrates in the chamber into which the vaporized chemicals will be delivered, and an apparatus which can clean itself after such production runs using plasma.

Substrates coated with such a process have reduced contamination, have more consistent monolayers with better bonds to the substrate.

SUMMARY

A process for the coating of substrates comprising insertion of a substrate into a process oven, plasma cleaning of the substrate, rehydration of the substrate, dehydration of the substrate, vaporizing chemicals in one or more vapor chambers, and transfer of the vaporized chemicals into a process oven, thereby coating the substrate. An apparatus for the coating of substrates comprising a process oven, a gas plasma subsystem, a metered chemical withdrawal subsystem, a vacuum subsystem, and a vaporization subsystem.

DETAILED DESCRIPTION

Figure 1:
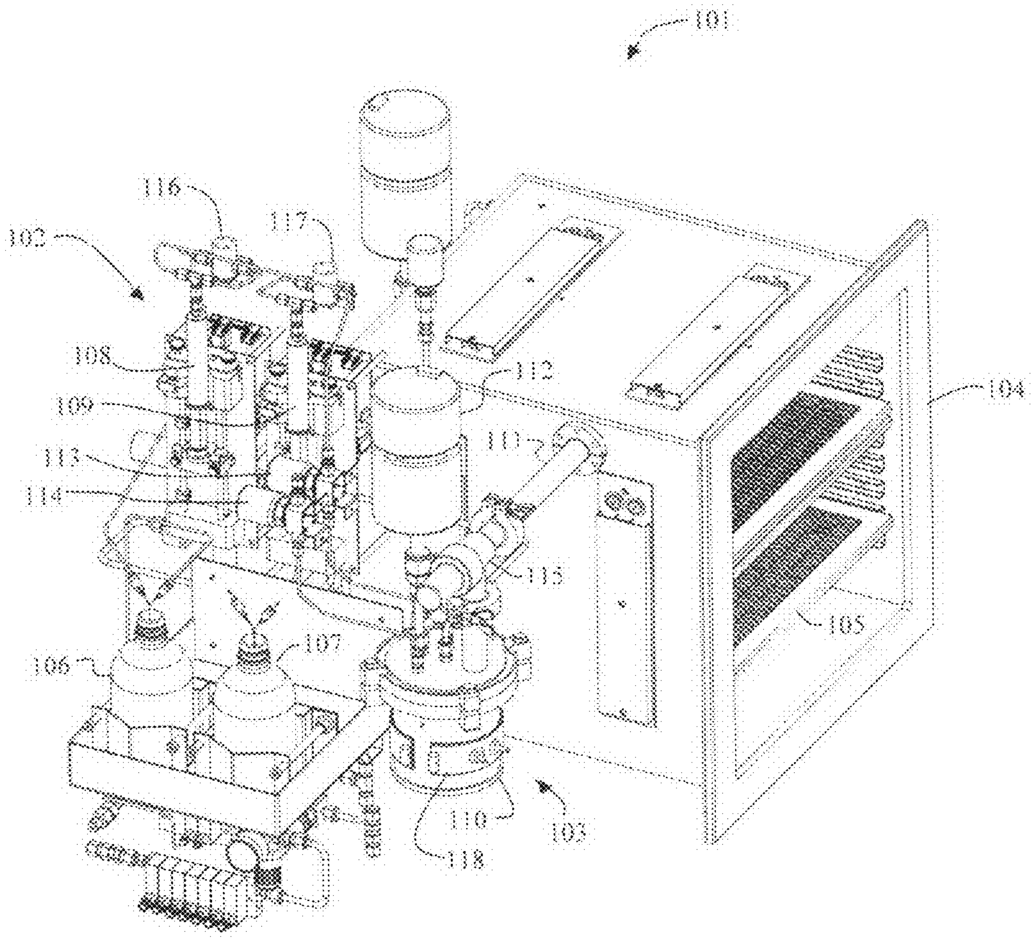
FIG. 1 is a pictorial representation of portions of one embodiment of the invention highlighting the chemical withdrawal, infuse, and vaporization subsystems.

In one embodiment of the present invention, as seen in FIG. 1, chemical vapor deposition apparatus 101 has a fluid input portion 102, a vaporization portion 103, and a process oven 104. Process oven 104 may be controlled with regard to both temperature and pressure. Fluid reservoirs 106, 107 provide the chemicals for the fluid input portion 102. Fluid reservoirs 106, 107, may be manufacturer's source bottles in some embodiments. Fluid reservoirs may contain the same fluid, allowing for the easy replacement of one reservoir if empty without disruption of the deposition process, or may contain separate chemicals. In some applications, water may be used as one of the chemicals in order to facilitate some rehydration of the substrate.

Chemicals in the fluid reservoirs 106, 107, are withdrawn into fluid input portion 102 by syringe pumps 108, 109. Although syringe pumps are used in this embodiment, other methods of withdrawal may be used, including peristaltic pumps and other appropriate methods. Chemical withdraw valves 116, 117, provide isolation between fluid reservoirs 106, 107, and syringe pumps 108, 109. Chemical withdraw valves 116, 117, are opened prior to withdrawal of chemicals from fluid reservoirs 106, 107.

Chemical infusion valves 113, 114 provide isolation between syringe pumps 108, 109, and the vapor chamber 110. The vapor chamber 110 is surrounded by vapor chamber heater 118. Although the vapor chamber heater is external to the vapor chamber in this embodiment, the vapor chamber heater may be internal to the vapor chamber or integral to the vapor chamber. The vapor chamber heater 110 may be P/N MBH00233 manufactured by Tempco, of Wood Dale, Ill., or other suitable heater. The vapor chamber 110 is fluidically coupled to process oven 104 by heated vapor line 111. The vapor chamber 110 may be isolated from process oven 104 by the operation of heated vapor valve 115. An example of such a heated vapor valve is valve P/N SS-8BK-VV-1C by Swagelok of Sunnyvale, Calif., with heater P/N 030630-41 by Nor-Cal Products of Yreka, Calif. The vapor chamber manometer 112 monitors the pressure inside vapor chamber 110. The process oven 104 may contain one or more trays 105. In some embodiments, there may be one or more vapor chambers fluidically coupled to the process oven.

Figure 2:
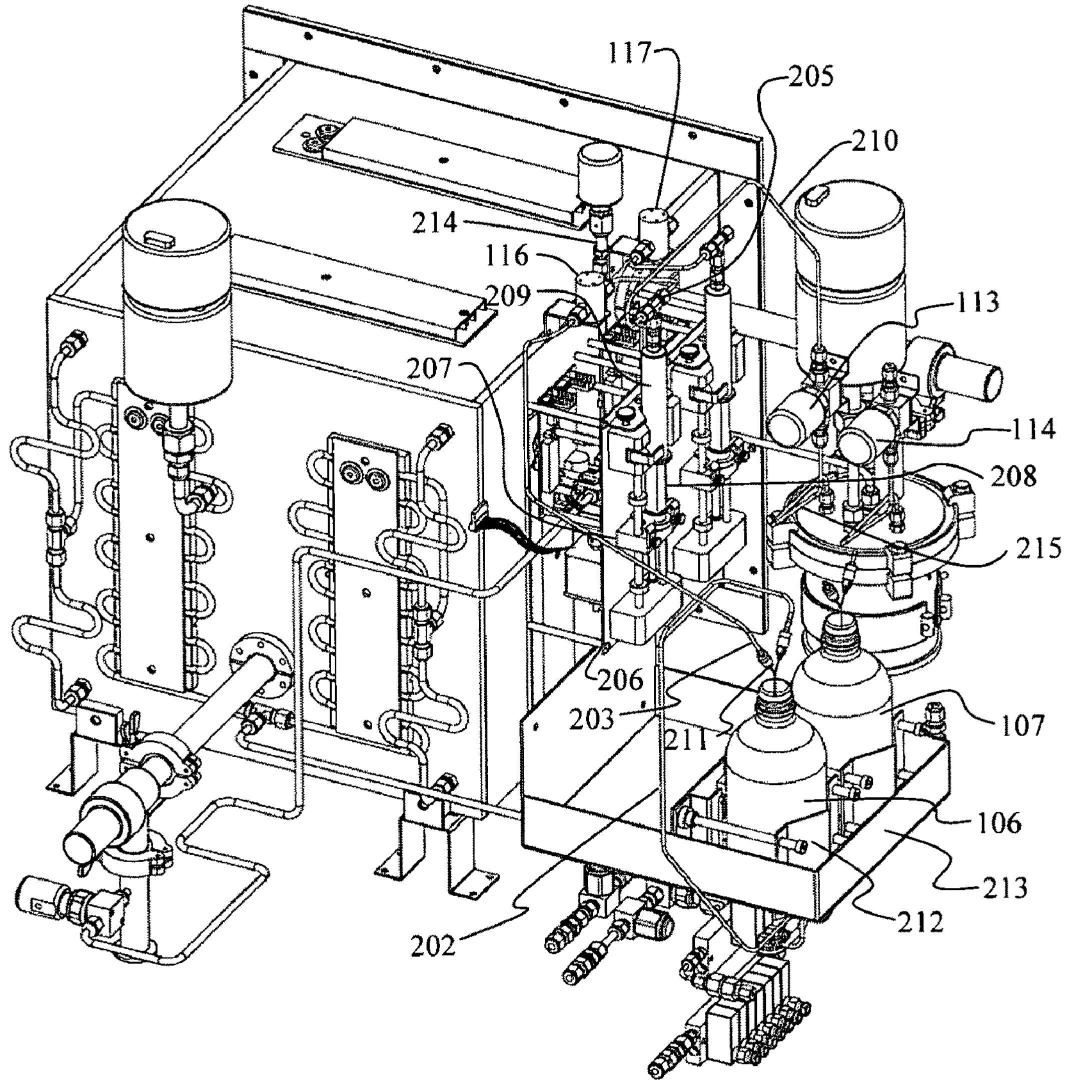
FIG. 2 is a pictorial representation of portions of one embodiment of the invention highlighting the chemical withdrawal and infuse subsystems.

In one embodiment of the present invention, as seen in FIG. 2, fluid input portion 102 routes chemicals from the fluid reservoir 106 through a delivery pipe 203 to the chemical withdraw valve 116. An example of such a chemical withdraw valve 116 is P/N 6LVV-DP11811-C manufactured by Swagelok of Sunnyvale, Calif. A fluidic coupler 211 is inserted into fluid reservoir 106 to allow fluid withdrawal from the fluid reservoir 106. In this embodiment, the fluid reservoirs 106, 107, are chemical source bottles. The fluidic coupler 211 also allows fluid such as dry nitrogen gas from pipe 202 to be inserted into the chemical reservoir 106 to fill the volume voided by the removal of chemical from the chemical reservoir 106. Exposure of the chemical to air and/or moisture is thus minimized. The syringe pump 206 may withdraw chemicals from fluid reservoir 106 when the chemical withdraw valve 116 is opened. An example of the syringe pump 206 is P/N 981948 manufactured by Harvard Apparatus, of Holliston, MASS. Actuation of the syringe pump mechanism 207 withdraws chemicals from the fluid reservoir 106 by partially or fully withdrawing the syringe plunger 208 from the syringe body 209. The amount of chemical withdrawn may be pre-determined, and also may be pre-determined with accuracy. The chemical is routed from the fluid reservoir 106, through the fluidic coupler 211 and the delivery pipe 203 to the chemical withdraw valve 116, through a pipe 214 and a T-coupler 205 to the syringe body 209 in this embodiment. In general, fluidic coupling can be referring to liquid or gas coupling in this embodiment.

After withdrawal of chemicals into the syringe body 209, the chemical withdraw valve 116 may be closed to isolate the delivery pipe 203. The chemical infusion valve 113 may then be opened to link the syringe body 209 to the vapor chamber 110. An example of such a chemical infusion valve 113 is P/N 6LVV-DP11811-C manufactured by Swagelok of Sunnyvale, Calif. The syringe pump mechanism 207 may then re-insert the syringe plunger 208 partially or fully into the syringe body 209, forcing the chemical within the syringe body 209 through the T-coupler 205 and then through pipe 210. With the chemical infusion valve 113 open, the chemical then may enter the vapor chamber 110 via pipe 215. Pressure within the vapor chamber 110 is monitored with the vapor chamber manometer 112. An example of such a manometer is a 0-100 Torr heated capacitance manometer P/N 631A12TBFP manufactured by MKS of Andover, Md.

The fluid reservoir 106 is secured with a spring clamp 212 within a source bottle tray 213. The source bottle tray 213 may also act as a spill containment vessel.

In some embodiments of the present invention, the fluid input portion 102 delivers the desired amount of chemical in another way. The chemicals in the fluid reservoirs are withdrawn in a pre-determined amount using a metering pump. For example, the metering pump may withdraw and deliver 2 milliliters per stroke. To deliver a specific quantity of a chemical, the metering pump would be pumped repeatedly until the desired quantity had been delivered. In some embodiments using metering pumps, the chemical withdraw valve and the chemical infusion valve are not necessary. The metering pump itself acts to isolate the fluid reservoir from the vapor chamber. Such embodiments allow for the delivery of the chemical from the fluid reservoir with less required hardware.

Figure 18:
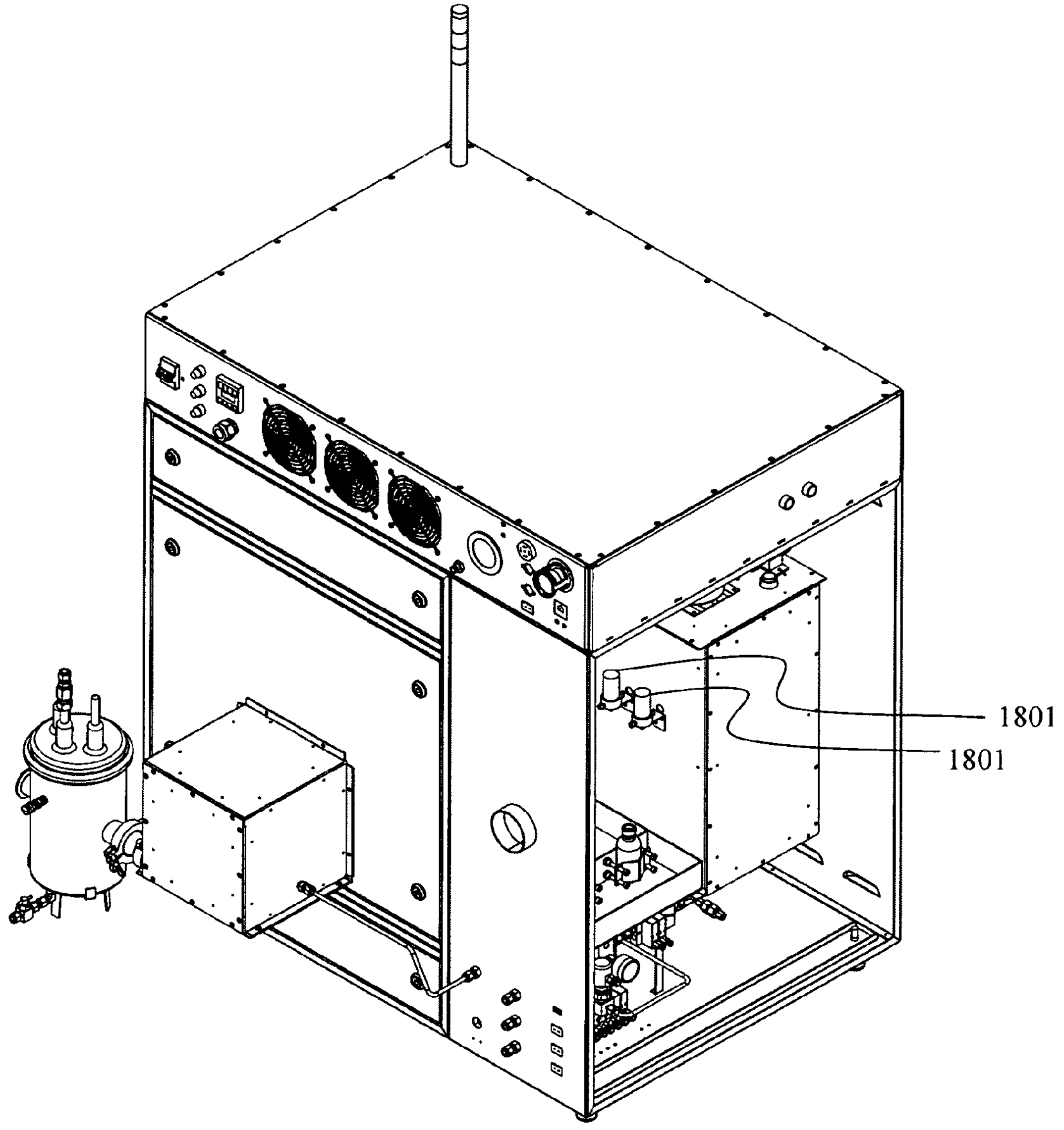
FIG. 18 is a partial view of one embodiment of the present invention displaying the metering pumps.
Figure 19:
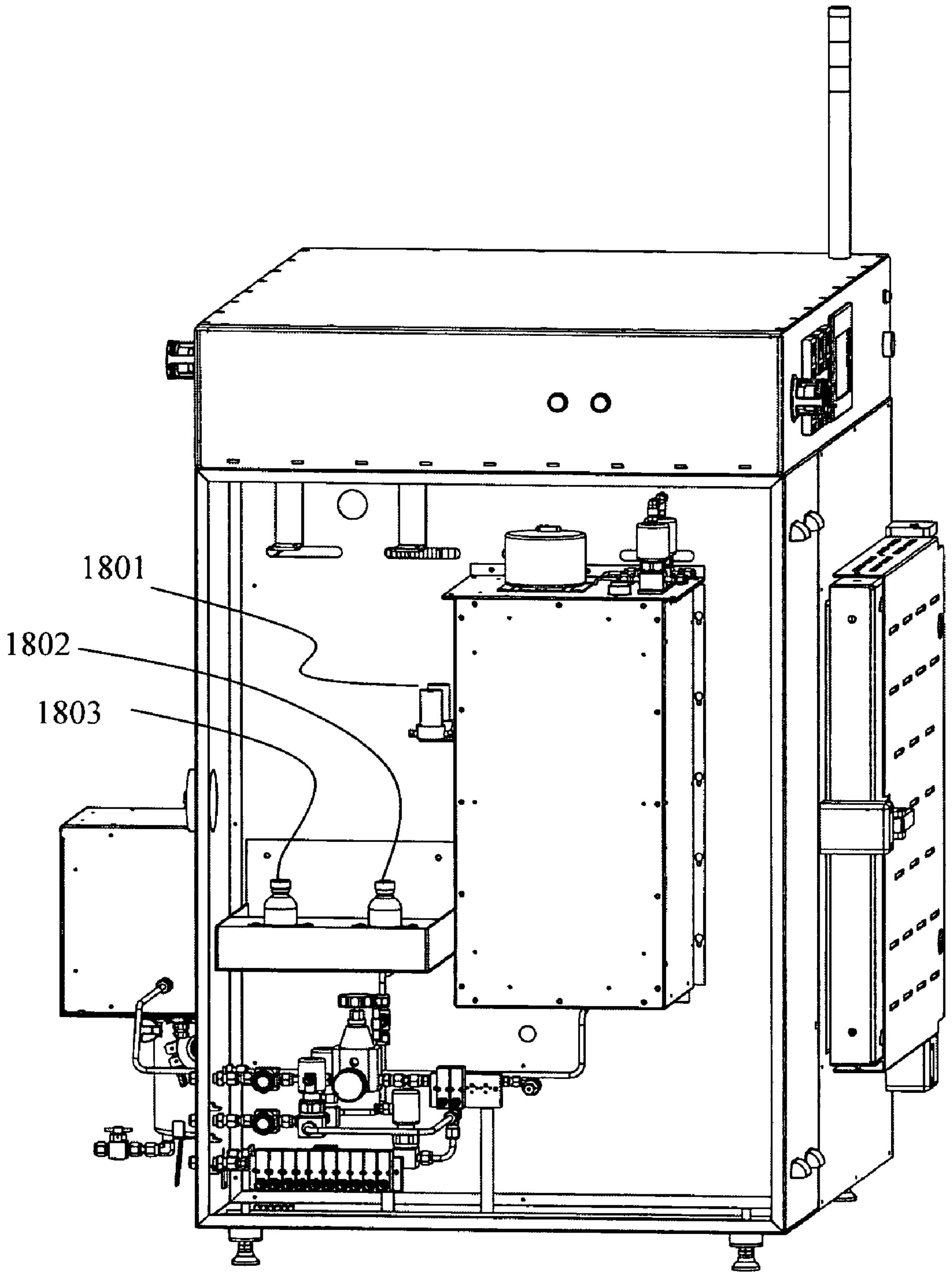
FIG. 19 is a partial view of one embodiment of the present invention displaying the metering pumps.

FIGS. 18 and 19 are partial cutaway views of an embodiment using metering pumps. The metering pumps 1801 are fluidically coupled to the vapor chamber. Chemical reservoirs 1802, 1803 are the source of supply of the liquid which the metering pumps 1801 pump into the vapor chamber (some piping is omitted in the Figures).

One of skill in the art will understand that the fluid input portion may have other embodiments that may use the above described elements in different types of combinations, or may use different types of elements.

Figure 3:
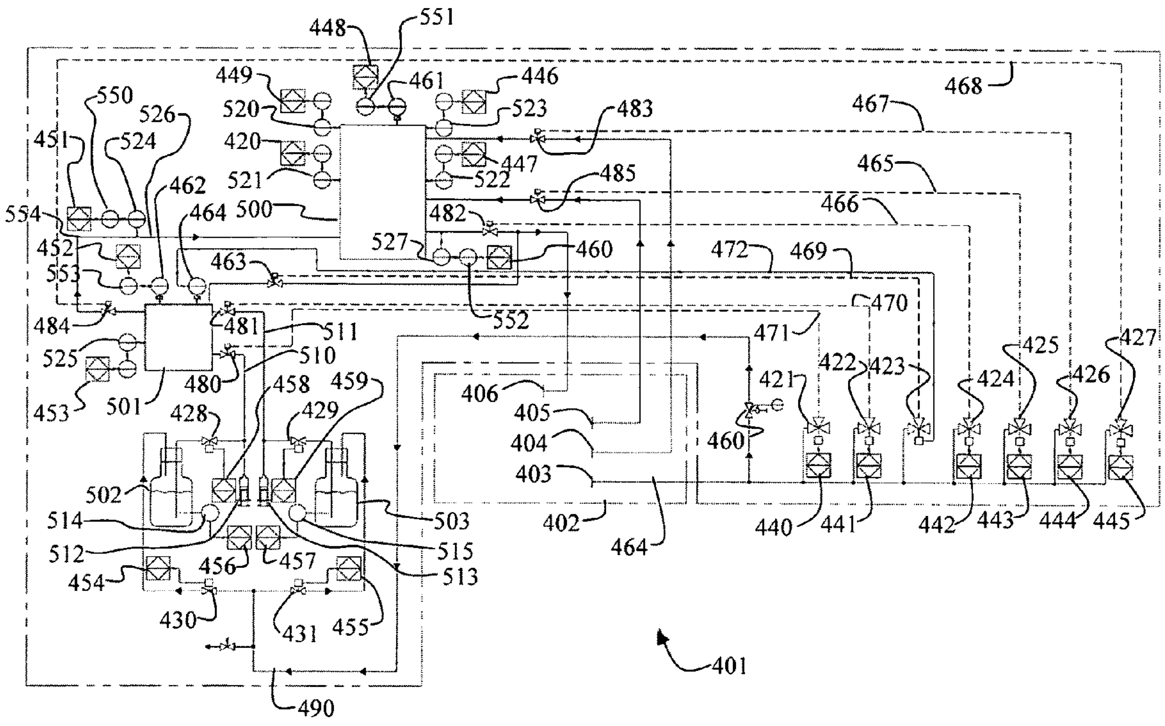
FIG. 3 is a representational piping schematic of one embodiment of the present invention.

In one embodiment of the present invention, as seen in FIG. 3, piping and other hardware is arranged as illustrated in the piping schematic 401. Vacuum and gas portion 402 illustrates the portion of the apparatus with inputs for gas and the provision of vacuum. In one embodiment of the present invention, a high pressure gas inlet 403 connects to 80-100 psig nitrogen, an inlet 404 connects to 5-15 psig of a process gas, and an inlet 405 connects to 15-40 psig nitrogen. A vacuum inlet 406 provides vacuum to the system.

The high pressure gas inlet 403 provides gas via a line 464 to the chemical reservoirs 502, 503, and also provides the pressure to actuate valves 463 and valves 480-484. Solenoids 421-427 are directed by a logic controller at I/O locations 440-445 to actuate valves 480-485 using solenoids 421-427. The gas from the high pressure gas inlet 403 is reduced in pressure to 4 psig by a pressure reducer 460 to be fed to the chemical reservoirs.

The solenoid acutated valves 430, 431 are triggered by directions from a logic controller at I/O interfaces 454, 455 to allow for purging of the chemical source bottle feed line 490.

When the solenoid 421 is directed by the logic controller via the I/O interface 440, high pressure gas is directed through a line 471 to actuate the chemical infusion valve 480, which connects the fluid line 510 from the syringe pump 512 to the vaporization chamber 501. When the solenoid 422 is directed by the logic controller via the I/O interface 441, high pressure gas is directed through the line 470 to actuate the chemical infusion valve 481, which connects the fluid line 511 from the syringe pump 513 to the vapor chamber 501.

When the solenoid 426 is directed by the logic controller via the I/O interface 444, high pressure gas is directed through the line 467 to actuate valve 483 which allows for the introduction into the process chamber 500 of gas from the inlet 404. When the solenoid 425 is directed by the logic controller via the I/O interface 443, high pressure gas is directed through the line 465 to actuate the valve 485, which allows for the introduction into the process chamber 500 of gas from the inlet 405.

When the solenoid 427 is directed by the logic controller via the I/O interface 445, high pressure gas is directed through a line 468 to actuate the heated vapor valve 484, which allows for the introduction into the process chamber 500 of vaporized chemical from the vapor chamber 501 via line 554. Temperature indicating controller 524 and temperature alarm high switch are coupled to I/O interface 451.

Solenoid operated valves 428, 429 allow the opening and closing of lines between the chemical reservoirs 502, 503 and the syringe pumps 512, 513. I/O interfaces 458, 459 control the operation of the solenoid operated valves 428, 429.

The level of chemical left in the chemical reservoirs 502, 503 is monitored with level sensors 514, 515 and routed to the logic controller via the I/O interfaces 456, 457. Level sensors 514, 515 are capacitance level switches P/N KN5105 by IFM Effector of Exton, Pa., in this embodiment.

The vapor chamber pressure switch 464 is linked directly by a line 472 to a solenoid actuated valve 423, which, when triggered, in turn triggers the gas actuated overpressurization limit relief valve 463. The overpressurization limit relief valve 463 connects the vapor chamber 501 to the vacuum line inlet 406. The vapor chamber pressure switch 464 triggers when the pressure in the vapor chamber 501 exceeds a preset pressure, which is 650 Torr in this embodiment.

The process oven manometer 461 feeds its signal to the logic controller via an analog interface (not shown). Overtemperature alarm 551 feeds its signal to the logic controller via I/O interface 448. An I/O interface 442 controls the solenoid actuated valve 424, which in turn can trigger the gas actuated heated vacuum valve 482 via a line 466, which links the process oven 500 to the vacuum inlet 406. A temperature monitor 527 monitors the vacuum line temperature and is linked to the logic controller via an I/O interface 460. Temperature alarm high switch 552 is linked to the logic controller via an I/O interface 460.

Temperature monitors 520, 521, 522, 523 monitor the temperature in the process oven 500. Temperature monitors 520, 521, 522, 523 are linked to the logic controller by an RS-485 interface (not shown). Alarms are present in the temperature monitoring system and are linked to the logic controller by I/O interfaces 446, 447, 449, 450.

Temperature monitors 524, 525 connected to I/O interfaces 451, 453 are also used to monitor the temperature of the heated vapor line 526 and the vapor chamber 501. A pressure monitor 462 is linked to the logic controller by an analog interface and overtemperature alarm 553 is linked to the logic controller by an I/O interface 452.

A logic controller may be used to control this apparatus in some embodiments. An example of such a controller is Control Technology Corporation Model 2700 of Hopinkton, Mass. One of skill in the art will understand that the apparatus may be controlled using a variety of suitable methods.

Figure 4:
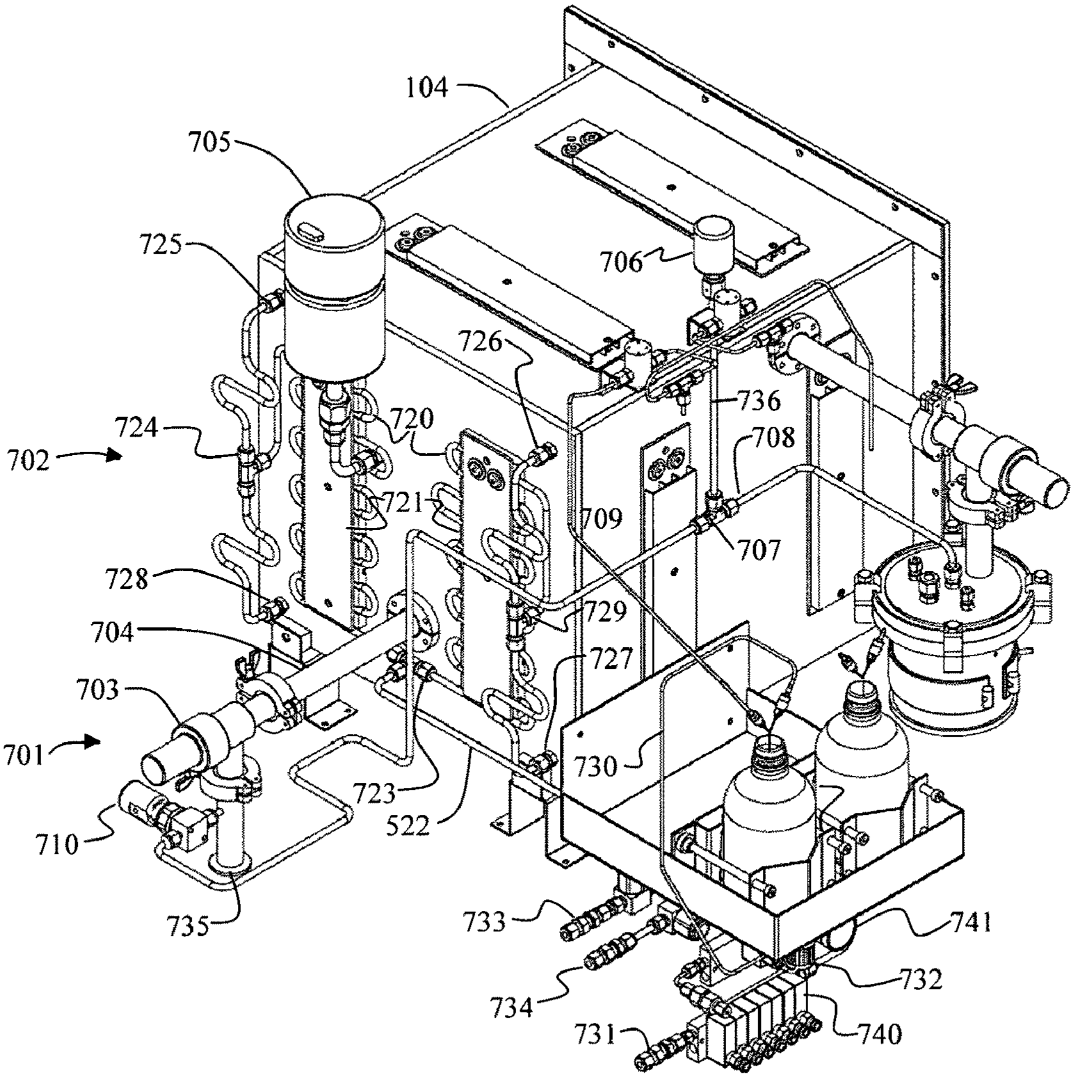
FIG. 4 is a pictorial representation of portions of one embodiment of the present invention highlighting the vacuum and gas delivery subsystems.

In one embodiment of the present invention, as seen in FIG. 4, a chemical vapor deposition apparatus 101 has a vacuum subsystem 701. Vacuum is applied to the vacuum subsystem 701 vacuum input supply line 735. A heated vacuum valve 703 may be actuated to isolate the heated vacuum line 704 from the vacuum input supply line 735. An example of the heated vacuum valve is P/N SS-8BK-VV-1C manufactured by Swagelok of Sunnyvale, Calif. The vacuum in the process chamber is measured using the chamber manometer 705. An example of such a manometer is P/N 631A13TBFP manufacture by MKS of Andover, Md. Vacuum input supply line is fluidically coupled to the overpressurization limit relief valve 710. An example of such a overpressurization limit relief valve is P/N SS-BNVS4-C manufactured by Swagelok of Sunnyvale, Calif. Overpressurization limit relief valve 710 couples vacuum input supply line 735 to line 709. T-coupler 707 links line 708, line 709, and line 736. Line 736 is fluidically coupled to vapor flask overpressurization limit switch 706. The overpressurization limit switch 706 is electrically connected to a solenoid actuated valve which supplies high pressure gas that actuates the overpressurization limit relief valve 710. An example of the vapor flask overpressurization limit switch is P/N 51A13TCA2AF650 by MKS of Andover, Md. Line 708 is fluidically coupled to vapor chamber 110.

A low pressure gas distribution manifold 733 distributes gas such as dry nitrogen for use in dehydration cycles. Inert gas such as dry nitrogen may be used in these lines. A purge manifold 732 allows for the purging of the fluid reservoirs and lines. The low pressure gas input line 522 is split at a T-coupler 723 into two serpentine lines 720. Gas line heaters 721 allow for the pre-heating of the gas prior to delivery of the process chamber. T-couplers 724, 729 further divide the delivery lines prior to input to the chamber at the gas inlets 725, 726, 727, 728.

A high pressure gas distribution manifold 731 provides gas for purge manifold 732 which inserts low pressure nitrogen into the fluid reservoirs 106, 107. A line 730 routes gas to a fluidic coupler 211 in order to replace the volume voided by chemical withdrawal. Inert gas such as dry nitrogen may be used in these lines. The low pressure regulator 741 reduces the pressure from the high pressure gas distribution manifold 731 upstream from purge manifold 732. The low pressure regulator 741 then provides gas to the purge manifold 732.

High pressure gas distribution manifold 731 provides high pressure gas that is routed to the gas actuated valves by the triggering of solenoid actuated valves in valve bank 740.

An alternative process gas distribution inlet 734 provides another inlet for process gas that may be used in some processes using this embodiment of the present invention. In this embodiment, the process gas lines are fluidically coupled to the low pressure gas lines upstream of the serpentine lines 720.

Figure 5:
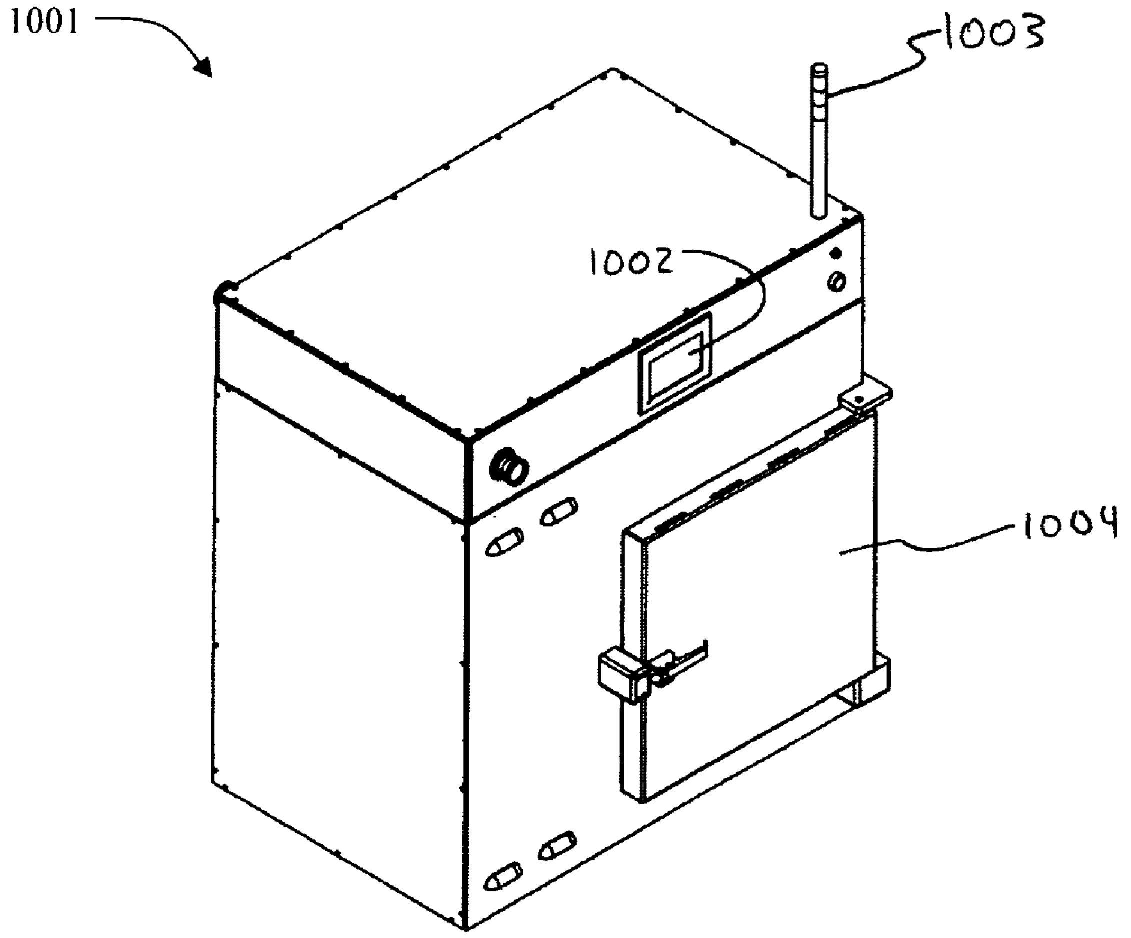
FIG. 5 is a front isometric view of one embodiment of the present invention.

As seen in FIG. 5, chemical vapor reaction apparatus 1001 has a touchpanel interface 1002. The light tower 1003 signals status of the apparatus to persons in the vicinity. Door 1004 provides access to the process chamber.

Figure 14:
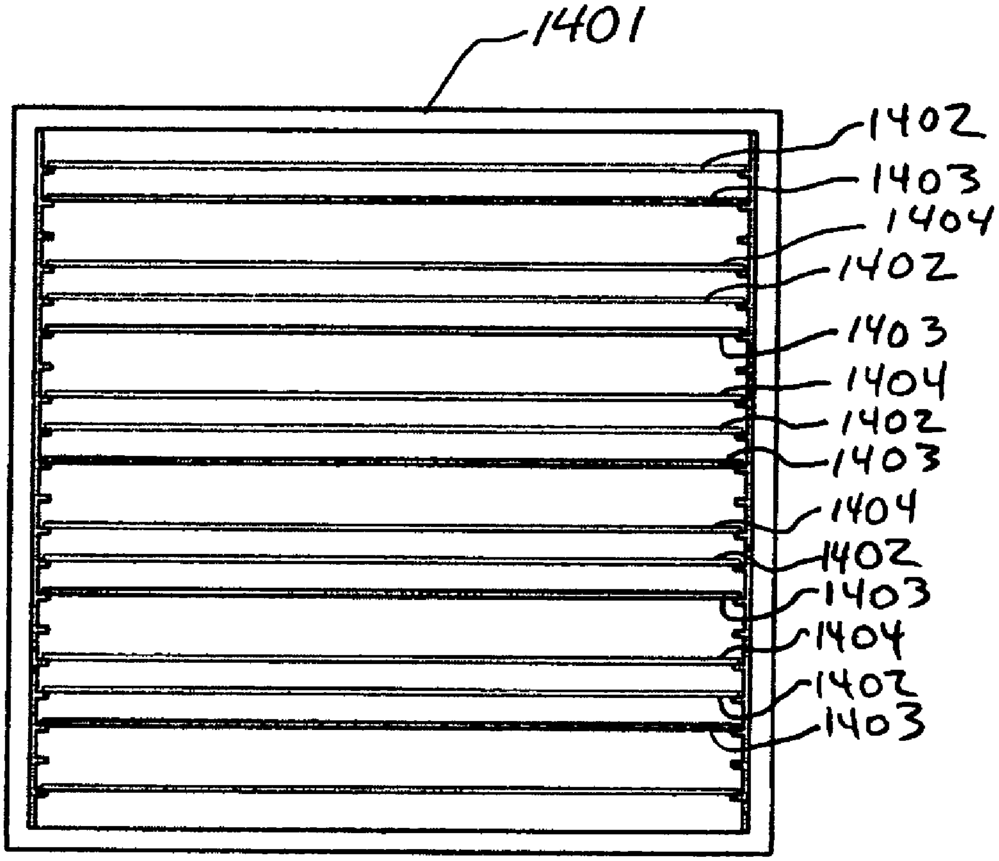
FIG. 14 is a view of the process oven interior according to one embodiment of the present invention.
Figure 15:
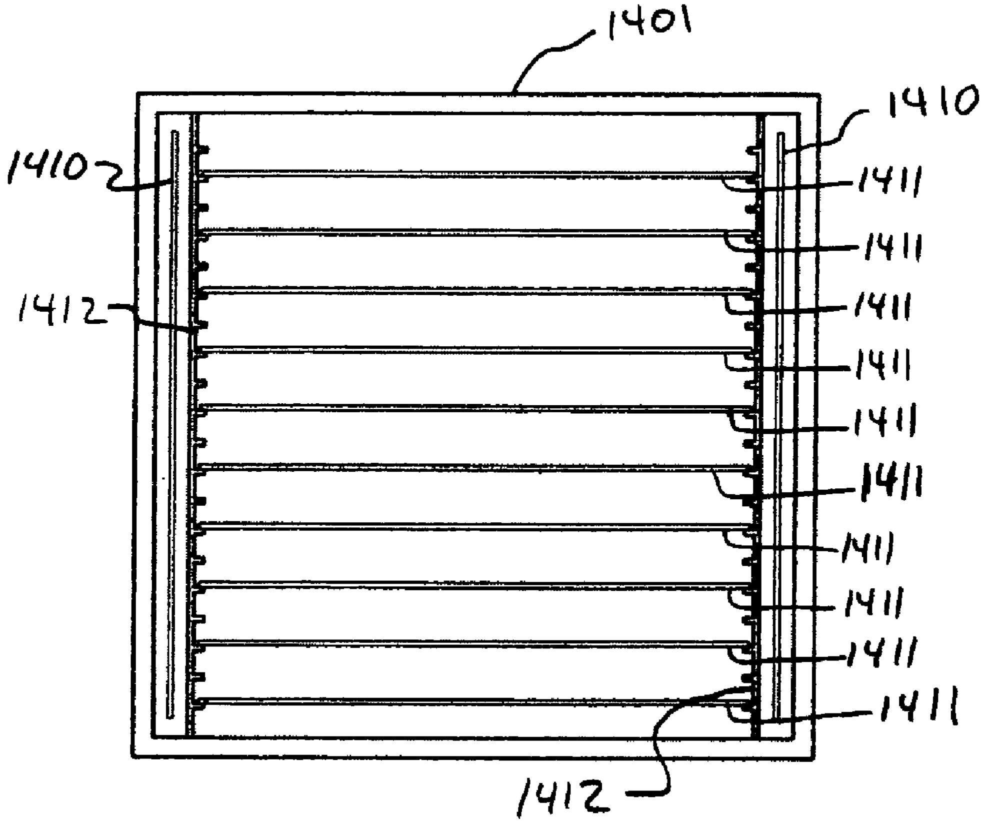
FIG. 15 is a view of the process oven interior according to one embodiment of the present invention.
Figure 16:
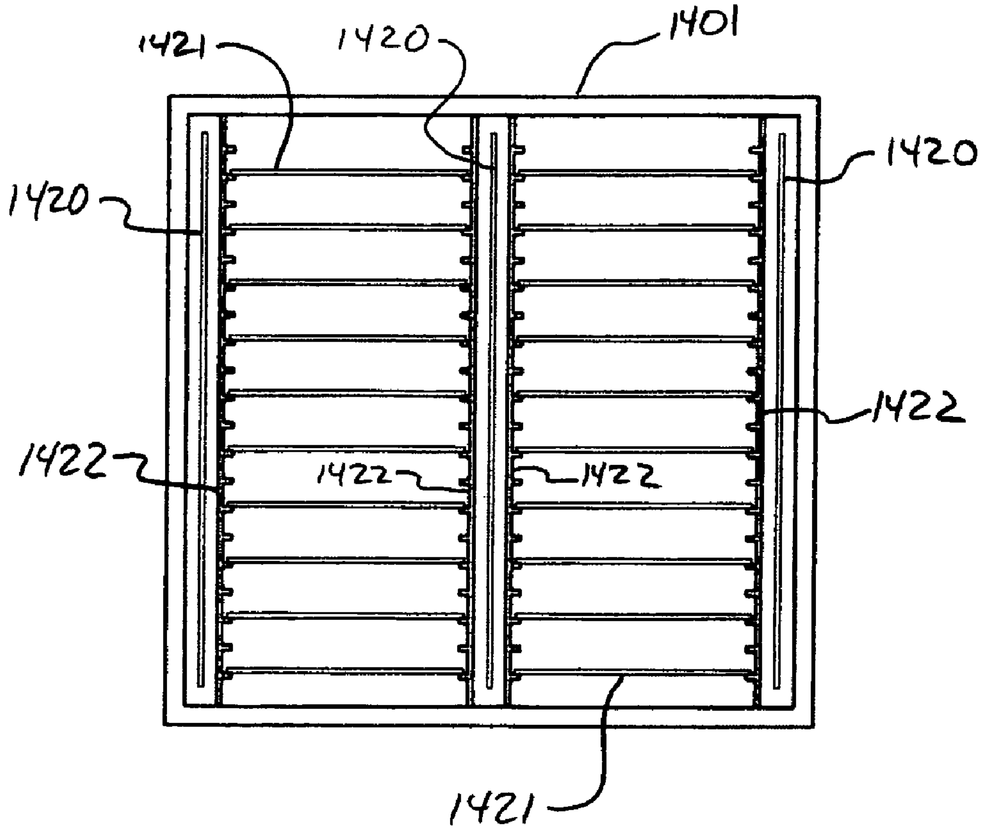
FIG. 16 is a view of the process oven interior according to one embodiment of the present invention.
Figure 17:
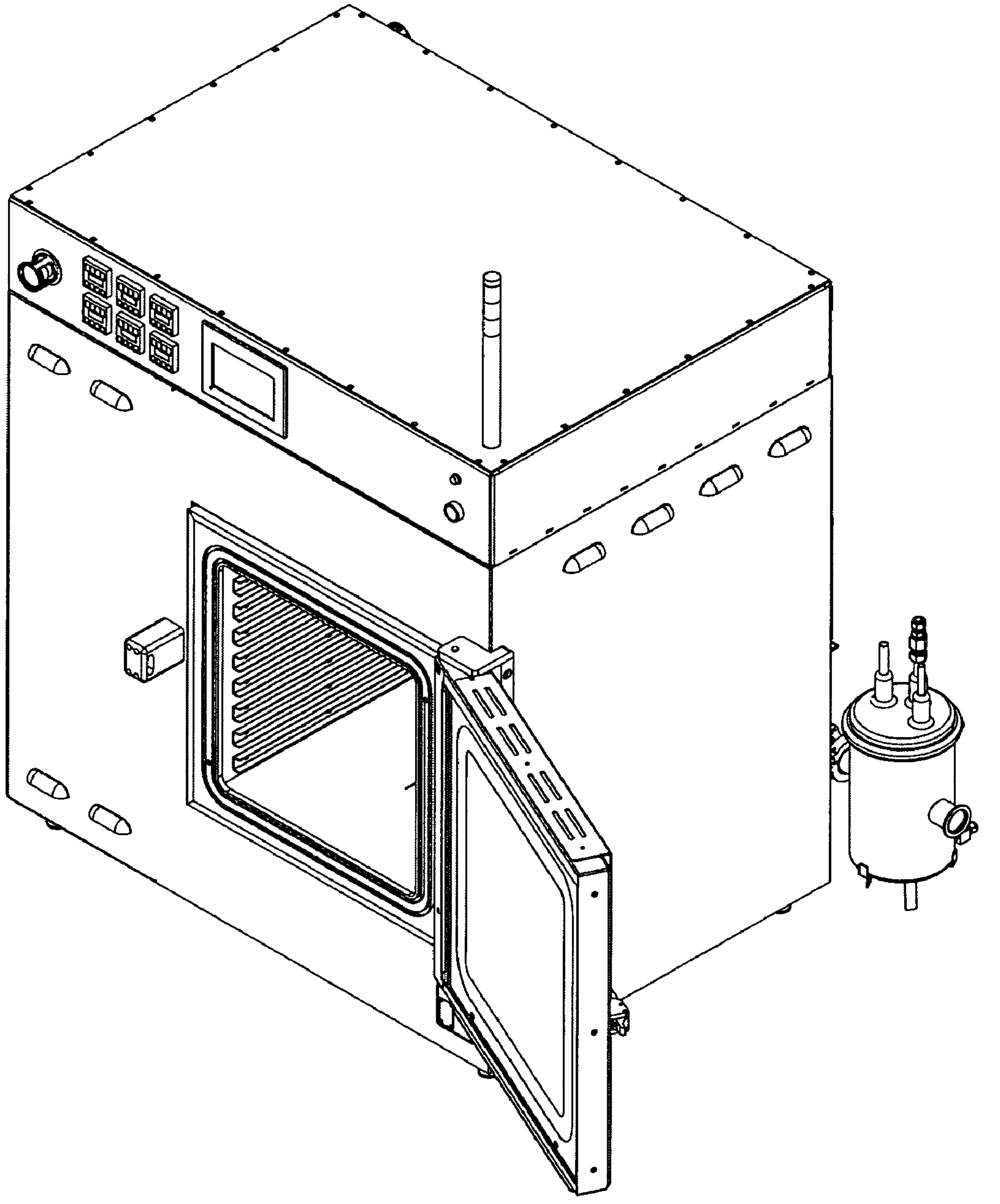
FIG. 17 is a view of the process oven with its door open according to some embodiments of the present invention.

In some embodiments of the present invention, as seen, in FIGS. 14 through 16, the process oven 104 houses a plasma gas generation system. The plasma gas generation system resides predominantly within the process oven chamber walls 1401. The gas plasma generation system is adapted to generate gas plasma within the process oven 104.

FIGS. 14 to 16 show several variations of capacitive plasma generation. Plasma may be generated with an appropriate gas in the presence of a strong electric field at an appropriate pressure. Capacitive plasma generation typically uses parallel plate electrodes to create the electric field. Electrodes may also be used to reduce the charging potential of a plasma and to concentrate the plasma in selected areas.

Capacitive plasma electrodes are commonly referred to as being electrically active, electrically grounded, or electrically floating. An electrically active electrode has a high voltage, typically 400-600 volts, placed on it to create an electric field with respect to other electrodes. The voltage is typically alternating current at a high frequency. The industry standard frequency for plasma equipment is 13.56 MHz. There are advantages to using a lesser frequency in the 40 to 50 KHz range. An electrically grounded electrode is connected to ground with a appropriate conductor so that it remains at ground voltage potential. An electrically floating electrode is isolated from all other electrical potentials and will be at some voltage level that depends on the influence of the plasma upon it.

FIG. 14 shows a horizontal electrode configuration that spans the process oven 104. Plasma is generated primarily between active electrodes 1402 and grounded electrodes 1403. Product material to be processed is typically place on the floating electrodes 1404. To reach the product, plasma must pass through the perforated grounded electrode 1403. Passing through the grounded electrode 1403 reduces the charging influence of the plasma and therefore reduces the charge that may be induced on the surface of product material by exposure to the plasma.

FIG. 15 shows a vertical electrode configuration with grounded product trays 1411. Plasma is primarily generated between active electrodes 1410 and grounded electrodes 1412. Plasma passes through the perforated, grounded electrodes 1412 and reduces it charging influence. The region between the grounded electrodes 1412 has no electric field and therefore no plasma generation. However, plasma concentrates in regions with zero electric fields when plasma generation is at relatively low frequencies, 40-50 KHz. The configuration of FIG. 15 therefore concentrates plasma with low charging influence around grounded product trays 1411.

FIG. 16 shows a configuration similar to that of FIG. 15 with an additional plasma generation region in the center of the chamber 104. Plasma is primarily generated between active electrodes 1420 and grounded electrodes 1422, Once again, product trays 1421 are electrically grounded and in a region where plasma is concentrated but with low charging influence.

In some embodiments, the product trays 1404 span the process oven 104. Active electrodes 1402 and ground electrodes 1403 span the process oven 104 horizontally. The RF power supply, cabling, and RF power feed through are known in the art.

In some embodiments, the plasma cleaning cycle may occur before the dehydration process. In an exemplary process, the chamber is evacuated. A gas is then introduced into the chamber and the pressure is stabilized at a low pressure, such as 150-200 milliTorr. In some embodiments, the introduced gas in oxygen. In some embodiments, the introduced gas is a combination of oxygen and argon. In some embodiments, other gasses are used.

The plasma gas generation system allows for plasma gas cleaning of a work piece, such as a slide or substrate, in the same chamber as that in which subsequent process steps will take place. This gives many advantages, including reducing possible contamination that may occur if the work piece is exposed to the environment after plasma cleaning. Also, the plasma gas generation system can be used to clean the oven after the work pieces have been processed and removed. Many of the chemicals that may be used in processes that this chamber supports may leave residues that can interfere with subsequent runs. The plasma gas generation system may be utilized to clean the chamber after a process run and prior to loading the chamber with the work pieces for the next run.

In some embodiments, as seen in FIG. 15, the active electrodes 1410 and the ground electrodes 1412 may span the interior of the process oven 104 vertically. The product trays 1411 may span the process oven 104 horizontally between the ground electrodes 1412.

In some embodiments, as seen in FIG. 16, there may be a plurality of vertical segments within the process oven 104. The ground electrodes 1422 and the active electrodes 1420 reside vertically within the process oven 104. The product trays 142 reside horizontally between ground electrodes 1422.

Figure 6:
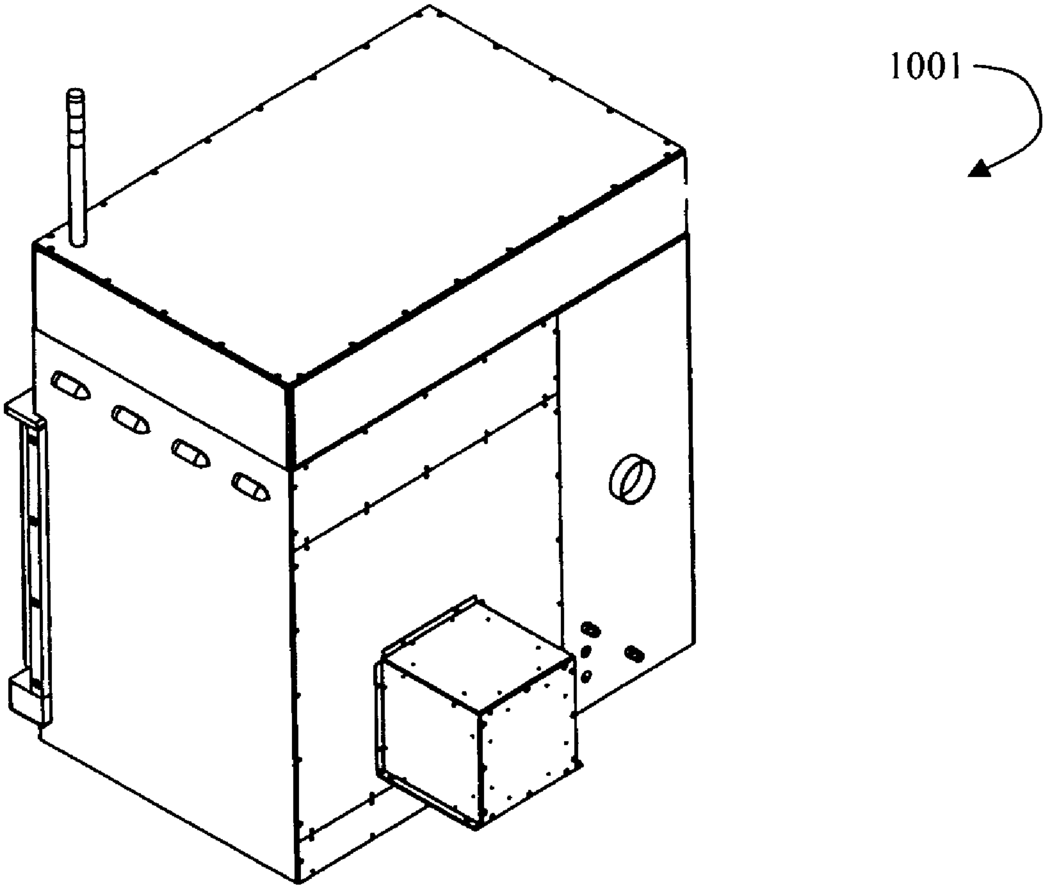
FIG. 6 is a rear isometric view of one embodiment of the present invention.
Figure 7:
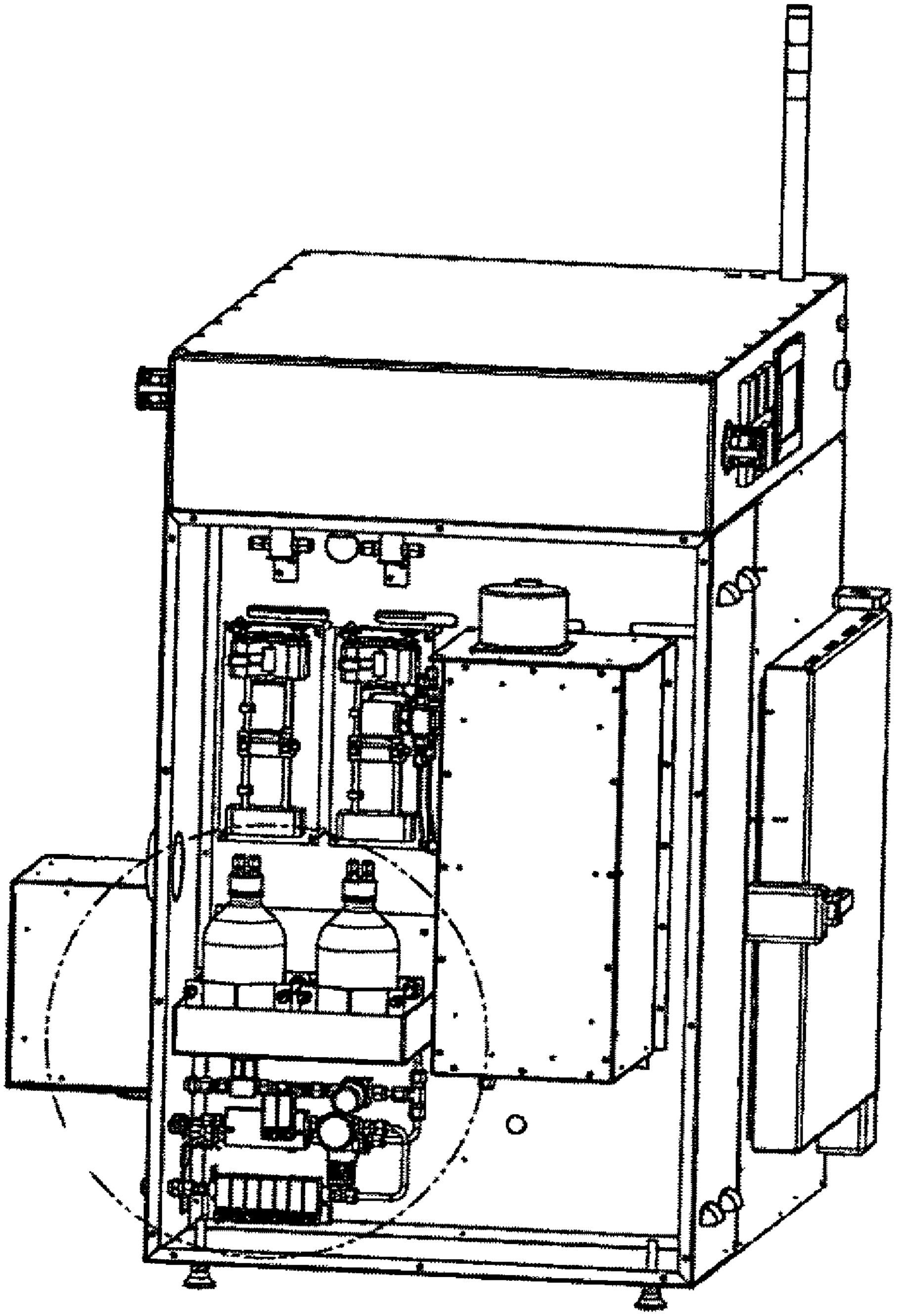
FIG. 7 is a partial cutaway side view of one embodiment of the present invention.
Figure 8:
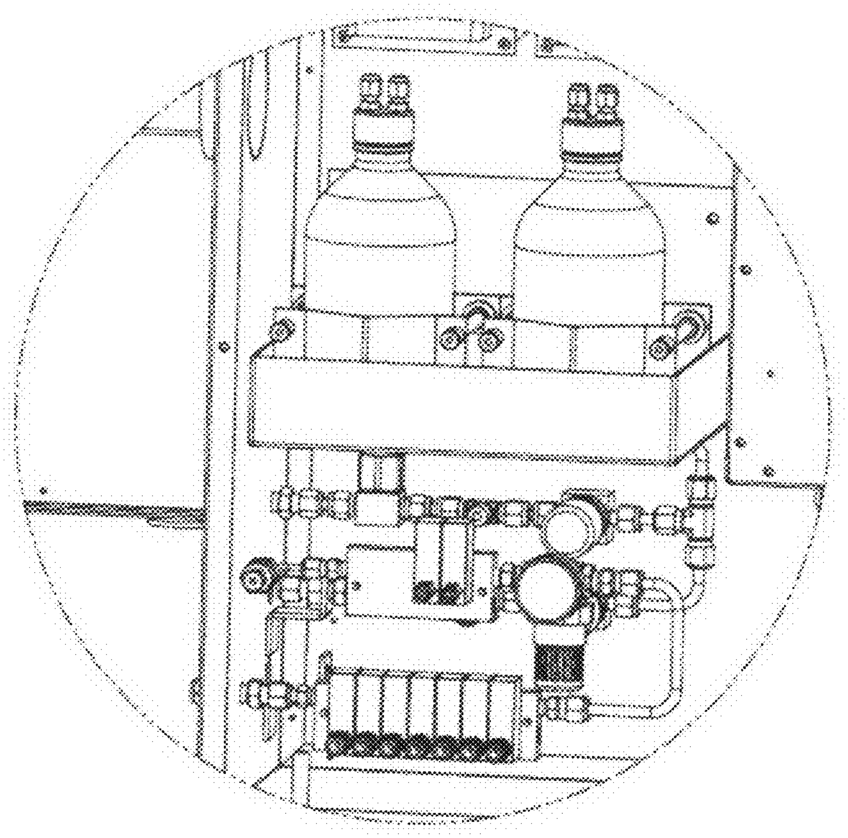
FIG. 8 is a blown up section of the partial side view of FIG. 7.
Figure 9:
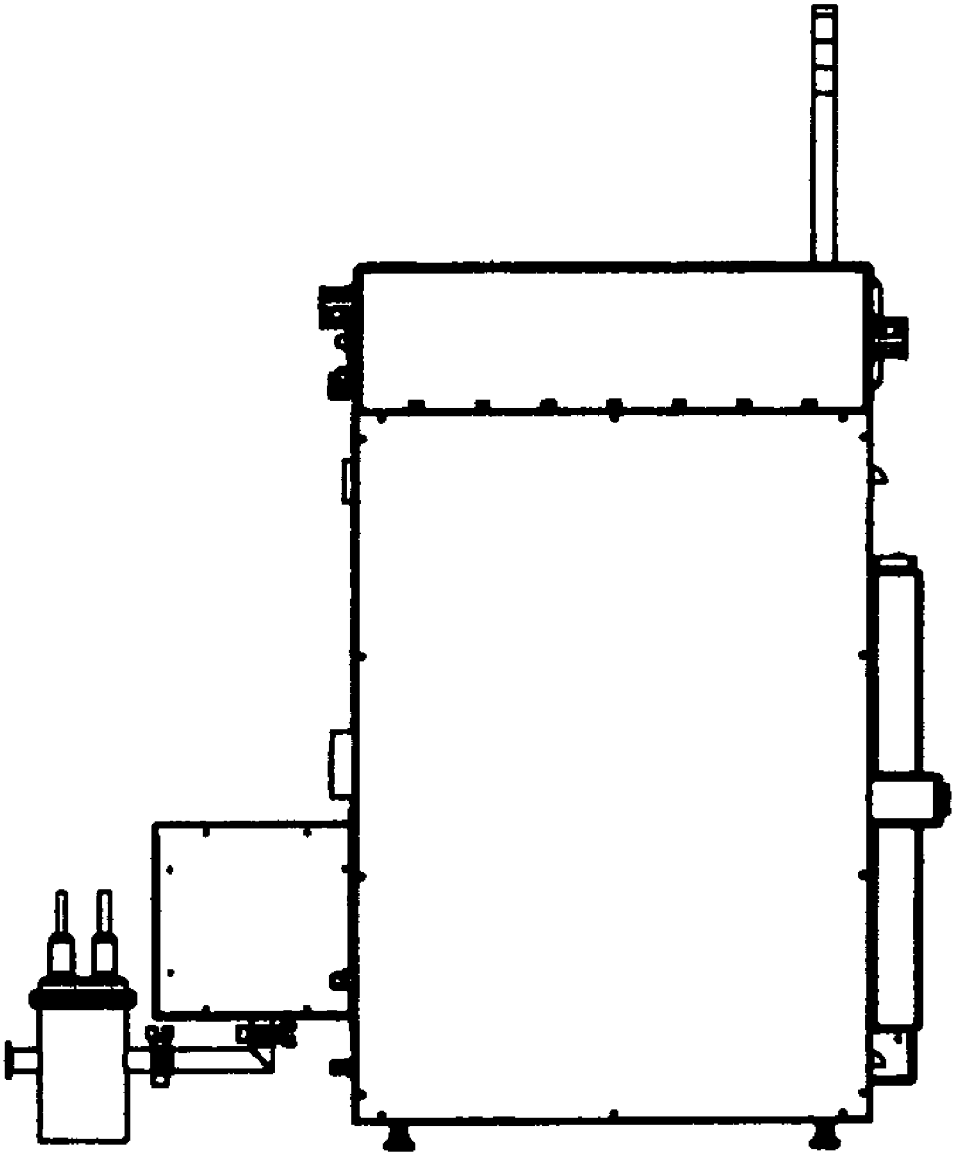
FIG. 9 is a side view of one embodiment of the present invention.
Figure 10:
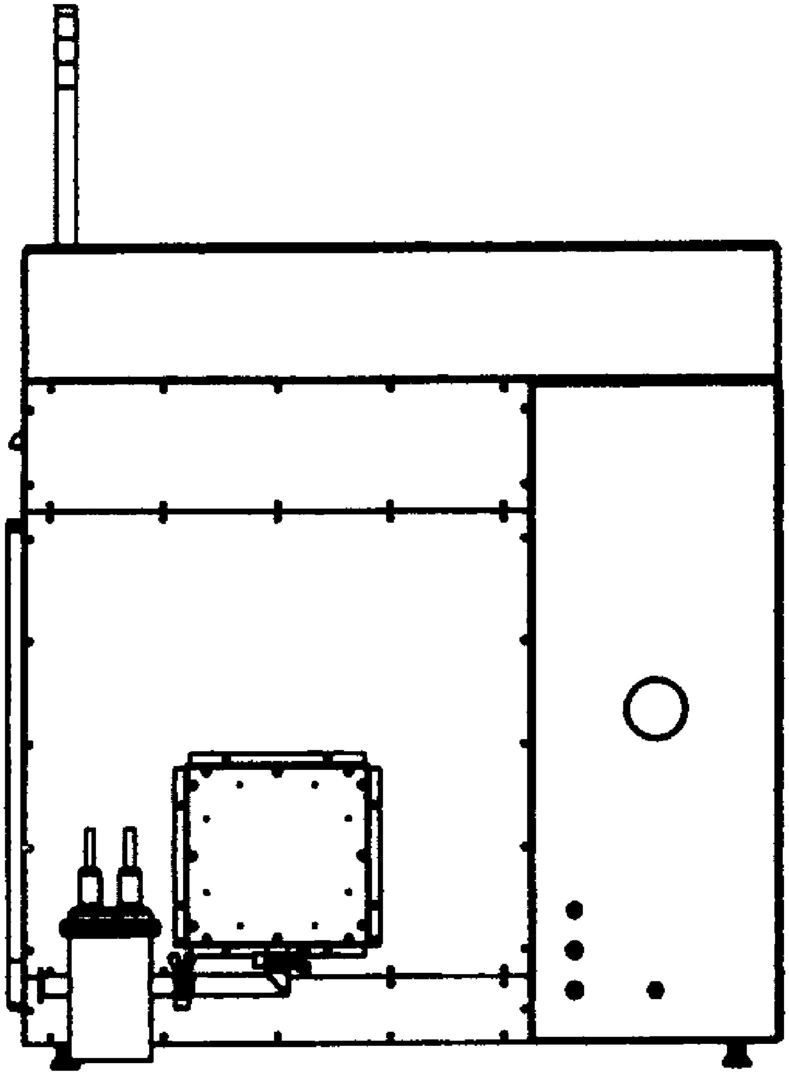
FIG. 10 is a rear view of one embodiment of the present invention.
Figure 11:
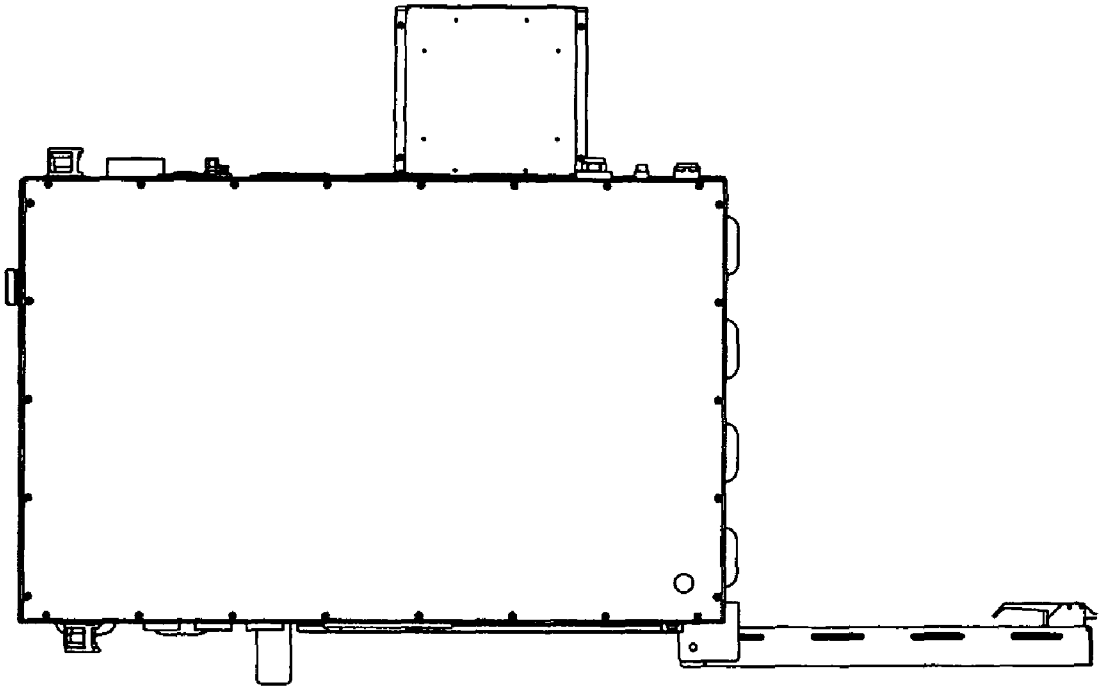
FIG. 11 is a top view of one embodiment of the present invention.
Figure 12:
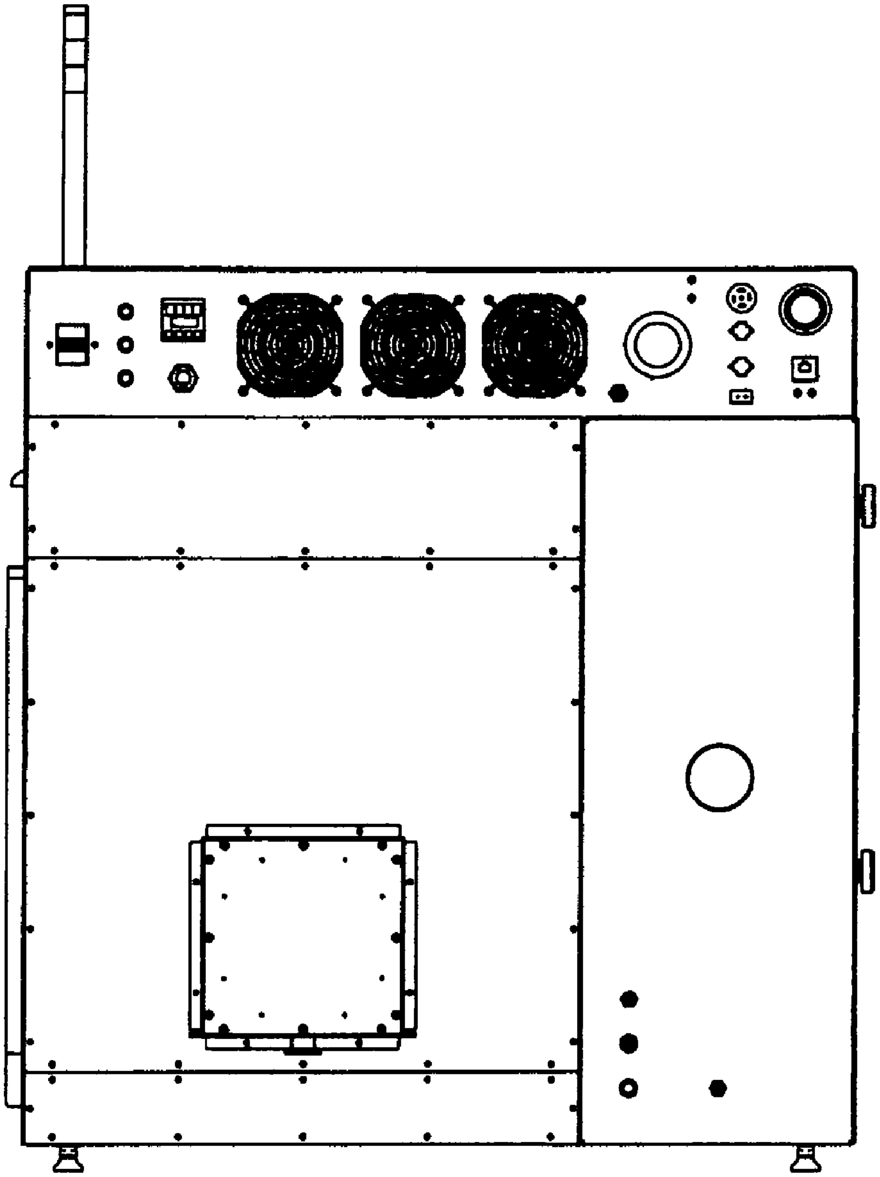
FIG. 12 is a rear view of one embodiment of the present invention.

FIG. 6 shows a rear isometric view of apparatus 1001. FIG. 7 is a partial cutaway side view of one embodiment of the present invention. FIG. 8 is a blown up section of the partial side view of FIG. 7. FIG. 9 is a side view of one embodiment of the present invention. FIG. 10 is a rear view of one embodiment of the present invention. FIG. 11 is a top view of one embodiment of the present invention with the process door open. FIG. 12 is a rear view of one embodiment of the present invention.

Figure 13:
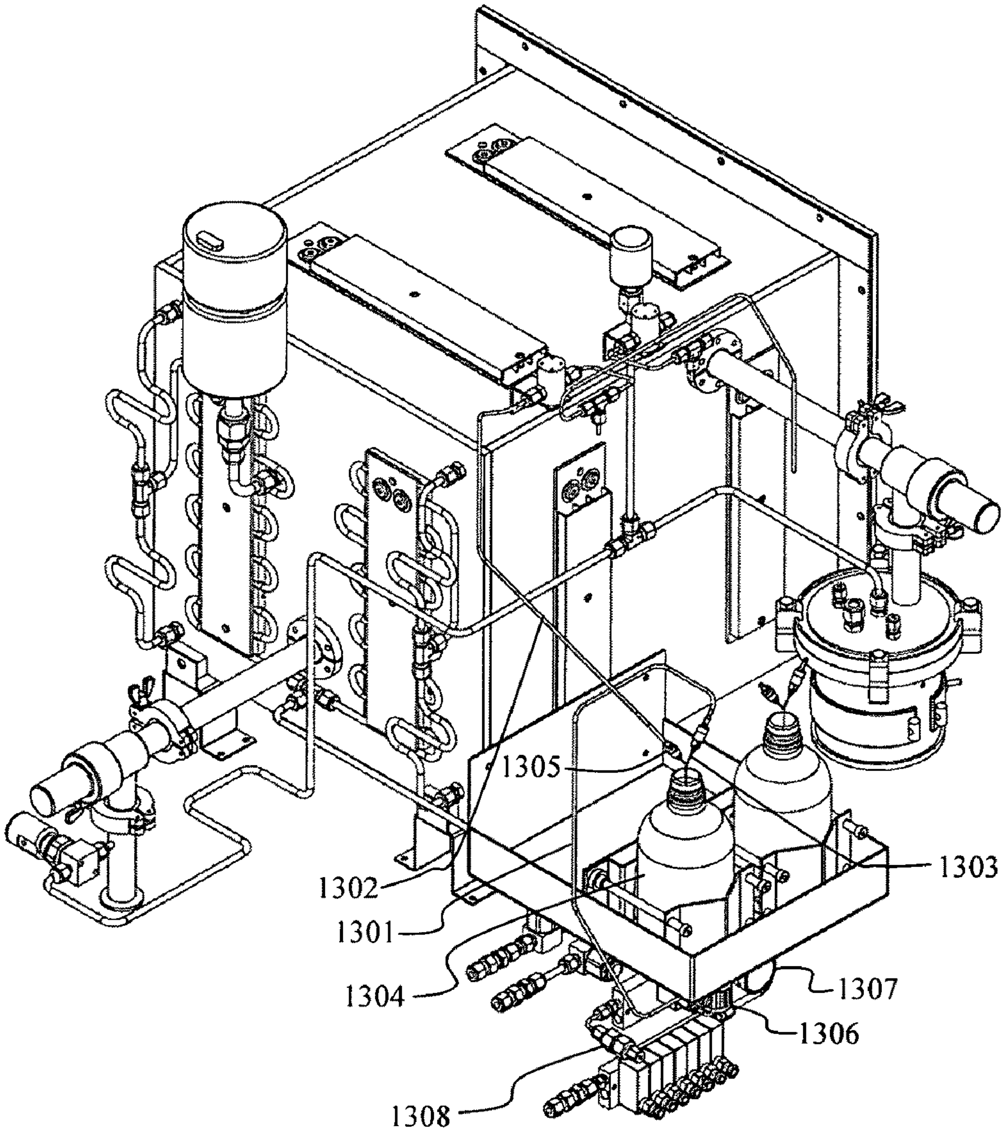
FIG. 13 is a partial cutaway view of one embodiment of the present invention.

FIG. 13 is a cutaway view of the vacuum subsystem and the chemical reservoir purge subsystem. A manufacturer's chemical source bottle 1304 is the chemical reservoir in this embodiment. The purge regulator 1307 feeds the purge manifold 1306 with a gas such as nitrogen. A 5 psi relief valve 1308 is located downstream from the purge manifold in this embodiment. Gas is routed to the bottle 1304 via a line 1301. Line 1301 connects to a fitting 1303 which routes the gas from line 1301 into the head portion of the source bottle 1304. The withdrawal line 1302 couple to the fitting 1305 for withdrawal of the chemical from the source bottle 1304. The tube supplying chemical to the withdrawal line 1302 terminates near the bottom of the inside of source bottle 1304. Line 1301 is delivered gas from the purge manifold 1306.

A process for the coating of substrates in a process chamber, which may include dehydrating the substrate, gas plasma cleaning of the substrate, and vaporizing the chemical to be reacted prior to its entry into the process chamber. Subsequent to the processing of the substrate, the chamber may be cleaned using gas plasma.

A substrate for the chemical deposition of different chemicals may be of any of a variety of materials. For biotech applications, a glass substrate, or slide, is often used. Glass substrates may be borosilicate glass, sodalime glass, pure silica, or other types. Substrate dehydration may be performed as part of some processes. The glass slide is inserted into the process chamber. The slide is then dehydrated. Residual moisture interferes with the adhesion of chemicals during the deposition process. Alternatively, dehydration of the slide allows for later rehydration in a controlled fashion. The dehydration process alternates exposing the glass slide to vacuum and then to heated nitrogen, either once or multiple times. For example, the glass slide would be exposed to a vacuum of 10 Ton for 2 minutes. At this pressure water boils at about 11 C. The vacuum chamber would then be flooded with preheated nitrogen at 150 C. This part of the process would heat the surface of the glass slide so that the high temperature of the slide would assist in the dehydration process as vacuum was once again applied. After 3 complete cycles, a vacuum of 1 Torr would be applied to complete the dehydration process.

A gas plasma cleaning cycle may also be used in preparation of the substrate for coating. In a some processes, the substrate is cleaned using gas plasma after the dehydration process. In some embodiments, the plasma cleaning cycle may occur before the dehydration process. In an exemplary process, the chamber is evacuated. A gas is then introduced into the chamber and the pressure is stabilized at a low pressure, such as 150-200 milliTorr. In some embodiments, the introduced gas in oxygen. In some embodiments, the introduced gas is a combination of oxygen and argon. In some embodiments, other gasses are used. After the stabilization of the pressure in the process chamber, the electrodes are powered to generate the plasma. In an exemplary process, the electrodes are powered to 450 Volts cycled at 40 kiloHertz. The power cycle may last for 2 minutes in some embodiments.

After the completion of the dehydration and plasma cleaning cycles, the slide or substrate is ready for chemical reaction. Chemical reservoirs, such as manufacturer's source bottles, provide the chemical for the deposition process. For many processes, silanes are used. Among the silanes used are amino silanes, epoxy silanes, and mercapto silanes. Chemical may be withdrawn directly from the reservoir. A metered amount of chemical is withdrawn from the chemical reservoir. This may be done by opening a valve between the chemical reservoir and a withdrawal mechanism. The withdrawal mechanism may be a syringe pump. Chemical is withdrawn from the reservoir, enters the syringe pump, and then the valve between the chemical reservoir and the syringe pump is closed. The chemical reservoirs may be purged with an inert gas such as nitrogen. This purging allows for the filling of the volume of fluid removed with an inert gas, minimizing contact between the chemical in the reservoir and any air or moisture.

Next, a valve between the syringe pump and a vaporization chamber is opened. The vapor chamber may be pre-heated. The vapor chamber may be a reduced pressure. The syringe pump then pumps the previously withdrawn chemical from the syringe pump to the vaporization chamber. The vapor chamber may be at the same vacuum level as the process oven. In parallel to this delivery of chemical to the vaporization chamber, a second chemical may be undergoing the same delivery process. The two chemicals may vaporize at substantially the same time. Additionally, more chemicals may also be delivered to the vaporization chamber, or to another vaporization chamber.

In some embodiments, the chemical or chemicals to be vaporized may be withdrawn from the reservoir or reservoirs in a specific metered amount. This specific amount of withdrawal and delivery to the vapor chamber may be repeated until the desired amount of chemical or chemicals has been delivered into the vapor chamber. For example, a metering pump may be used. The metering pump may deliver a predetermined amount of chemical per stroke of the metering pump. The number of pump strokes may be selected, thus delivering a specified amount of chemical.

The reduced pressure in the vapor chamber, and/or the elevated temperature in the vapor chamber may allow for the vaporization of chemicals at pre-determined pressure levels and temperatures.

The vaporized chemical, or chemicals, are then delivered to the process chamber. This may be done by opening a valve between the vaporization chamber and the process oven after the chemical has vaporized in the vaporization chamber. Alternatively, the valve between the vaporization chamber and the process oven may already be open when the chemical, or chemicals, are delivered to the vaporization chamber. The chemical then proceeds into the process chamber and reacts with the substrate.

In some embodiments, the chemical may be added into the vapor chamber with the valve between the vapor chamber and the process chamber open. The chemical may be continued to be added into the vapor chamber until the vapor pressure in the process chamber reaches a desired level. At that time, the valve between the vapor chamber and the process chamber may be closed. The chemical may then remain in the process chamber for the desired amount of time for reaction.

In some embodiments, the chamber may be cleaned using gas plasma subsequent to the processing steps. The chamber may be emptied of all workpieces and then cleaned. The gas plasma cleaning step subsequent to the processing steps helps prepare the process chamber for subsequent processing.

Figure 20:
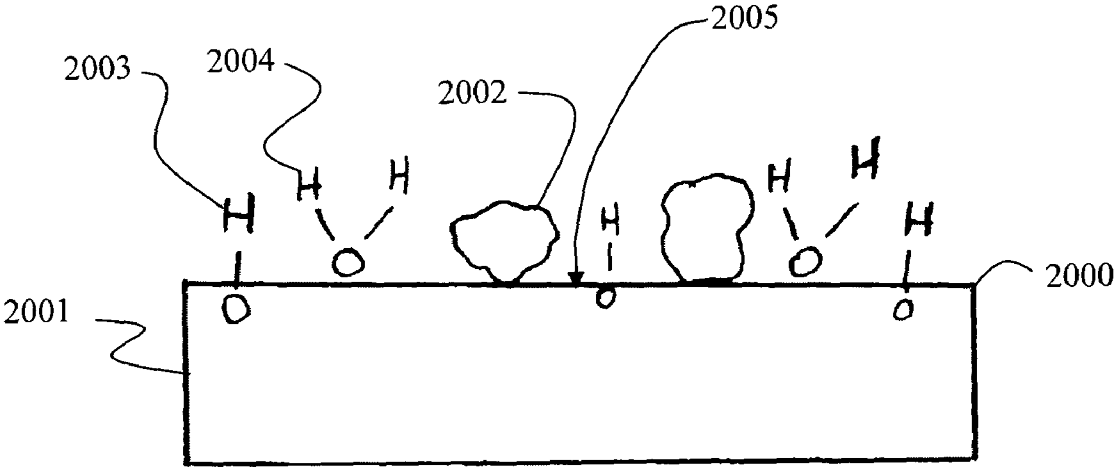
FIG. 20 is a sketch of a substrate with surface moisture and surface particulate contamination.

In some embodiments of the present invention, a process utilizes plasma cleaning, rehydration, dehydration, and chemical reaction. In some embodiments, all of the steps of the cleaning, rehydration, dehydration, and chemical reaction may take place in a single process chamber, which may greatly reduce the likelihood of any contamination or exposure to moisture of the substrates between process steps. In some embodiments, the process may take place in a single process chamber wherein many substrates may be simultaneously processed. FIG. 20 illustrates a substrate with moisture and contaminants 2000. The underlying substrate 2001 is seen, which may be of silicon, glass, or other material. A variety of items are seen across the surface 2005 of the underlying substrate 2001. Embedded hydroxyls 2003 are seen linked to the surface 2005 of the substrate 2001. In some processes, the embedded hydroxyl is needed for reaction with a vaporized chemical in order to form a layer on the substrate. Although just a few embedded hydroxyls are shown, it is understood that there may numerous embedded hydroxyls across the surface of a substrate. Water molecules 2004 are seen on the surface 2005 of the substrate 2001. This surface moisture may interfere with the quality of the layer in some processes, as discussed below. Contaminant particles 2002 are also seen on the surface 2005 of the substrate 2001. Other chemical compounds may be present on the surface of the substrate.

Figure 21:
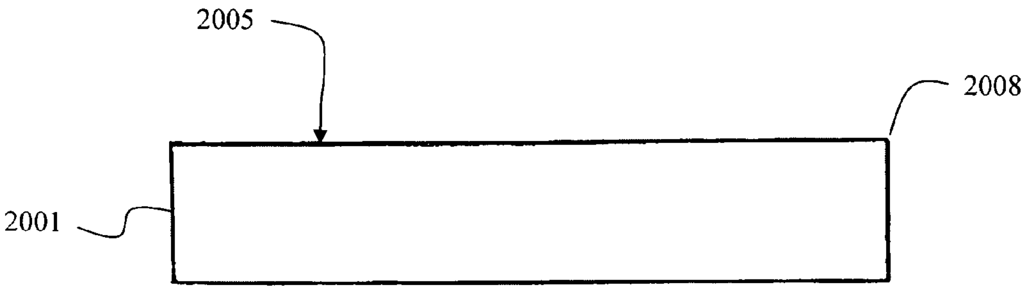
FIG. 21 is a sketch of a substrate after plasma cleaning.

In some embodiments of the present invention, a process for the coating of, or coating created by the reaction with, a substrate may elect to clean or modify the substrate using plasma as a beginning step. As seen in FIG. 21, a cleaned substrate 2008 is shown wherein the top surface 2005 of the substrate 2001 no longer has any residual moisture, embedded hydroxyls, or other types of contamination. Plasma may be used to remove contamination from a surface, and also to modify a surface for better adhesion. In a case, for example, wherein the surface of a substrate is an organic compound such as a solvent residue, perhaps from an earlier process, an oxygen plasma may be used. The oxygen plasma will remove organics from the surface, and will modify the surface for adhesion. If the surface is known to be free of such compounds, or if there is a desire not to oxidize the surface, an inert gas such as argon, or a reducing gas such as hydrogen may used in the plasma step.

After the removal of the surface items from the substrate, the substrate may still not be in an appropriate condition for subsequent chemical reaction. The plasma operation may remove all items on the surface of the substrate. Yet some chemicals which will form a layer on the substrate in some processes may rely on hydroxyl ions being in place to react with. Thus, a rehydration step may be required in some embodiments. Water may be introduced into the process chamber while the chamber is still under vacuum. The water will have a percentage of its volume that is dis-associated to a hydroxyl ion and a hydrogen ion. The portion that is free as hydroxyl ions is available to embed in the surface of the substrate. A silicon substrate, for example, has an affinity for oxygen, and will attract the oxygen of the hydroxyl ion. The oxygen portion of the hydroxyl ion may embed itself in the surface of the substrate, with the hydrogen portion of the hydroxyl ion then above the surface. This may provide an excellent anchored site for a chemical to react with in order to form a layer on the substrate.

Figure 22:
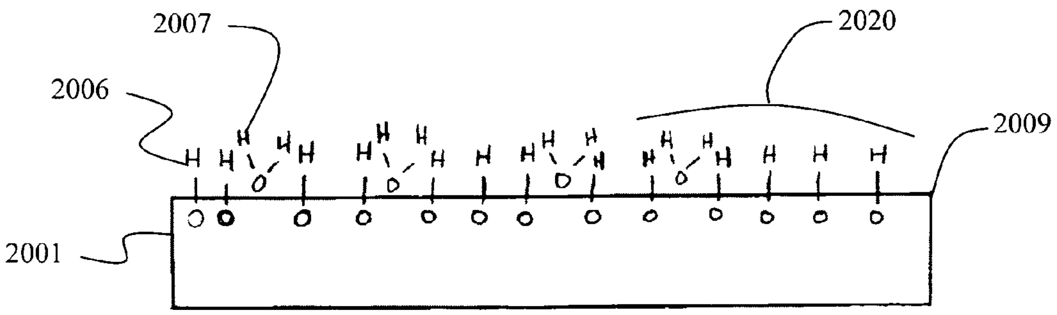
FIG. 22 is a sketch of a substrate with embedded hydroxyls and surface moisture according to some embodiments of the present invention.

FIG. 22 illustrates a rehydrated substrate 2009 seen after a rehydration step. A substrate 2001 is seen with embedded hydroxyls 2006 and surface moisture 2007. The hydoxyls 2006 are seen with the oxygen into the substrate 2001, and the hydrogen up on or above the surface of the substrate. Surface moisture 2007 is seen wherein the water molecule resides on the surface of the substrate. Due to the affinity of the substrate to oxygen, the water molecule may reside with the oxygen down at the surface of the substrate, and the hydrogens facing away. A portion 2020 of the surface of the rehydrated substrate 2009 shows a water molecule in part above adjacent hydroxyls, which may block or limit the availability of these hydroxyls for chemical reaction with a subsequently added vaporous chemical. The rehydration may be performed by adding 0.2 ml of water to the chamber, with the chamber at 0.5 Torr. This may be done by adding the water to a separate vaporization chamber that is coupled to the process chamber, while the entire system is under vacuum. The system may have stayed under vacuum since the conclusion of the earlier plasma step. There may be a separate vaporization chamber just for the use with water. The addition of the drop of water may raise the pressure in the chamber to 4 Torr in some embodiments.

Figure 23:
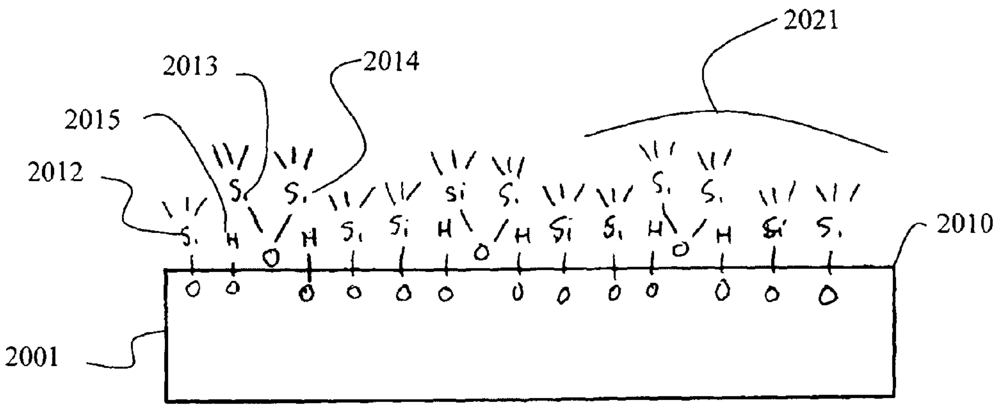
FIG. 23 is a sketch of a substrate with silane compounds reacted to embedded hydroxyls and surface moisture according to some embodiments of the present invention.

FIG. 23 illustrates a coated substrate 2010 which has been reacted with silane according to some embodiments of the present invention. The substrate had been reacted with silane after the plasma cleaning and the rehydration steps. The substrate 2001 is seen with silane 2012 anchored to oxygen that is embedded in the surface, in a position where there had been an embedded hydroxyl ion. Silane 2013 is also seen supplanting the hydrogen where the surface moisture water molecule had been located. Embedded hydroxyl 2015 is seen adjacent to the silane 2013 in the water location, and may have remained because the surface moisture had interfered with the vaporized silanes access to this embedded hydroxyl during the reaction cycle. A portion 2021 of the silane layer may consist of some silane which is anchored firmly to the substrate via oxygen from what had been an embedded hydroxyl, and some silane which is attached to surface moisture.

Figure 24:
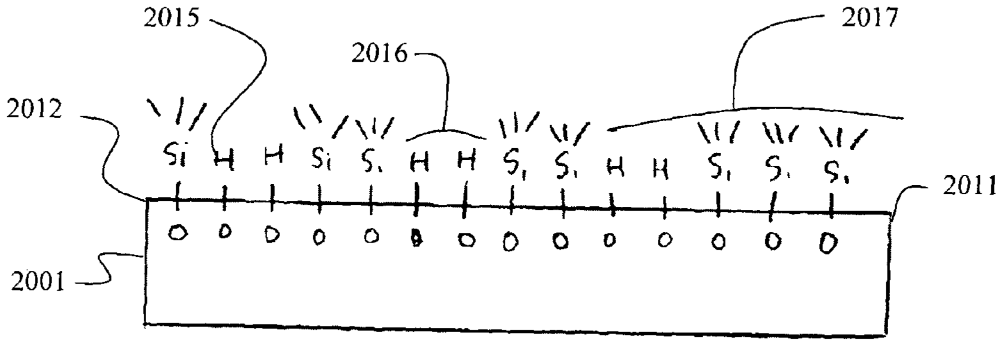
FIG. 24 is a sketch of a substrate after some silane layer degradation.

FIG. 24 illustrates the condition of a coated substrate 2011 upon which silane was reacted directly onto a rehydrated substrate 2009 after exposure to further moisture or other environmental exposure. The subsequentally exposed substrate 2011 is seen where the portions of the silane layer which had reacted to surface moisture have been swept away, leaving a gap 2016 in the layer which may show hydroxyls 2015, which may have been covered during the earlier silane reaction step. Thus, a portion 2017 of the upper surface of the coated substrate 2011 may show hydroxyls and silane. The gaps in the layer may be deleterious to the function of the silane layer in some embodiments. For example, if the silane layer were to function as a boundary layer, the gaps would reduce the effectiveness of the boundary.

Figure 25:
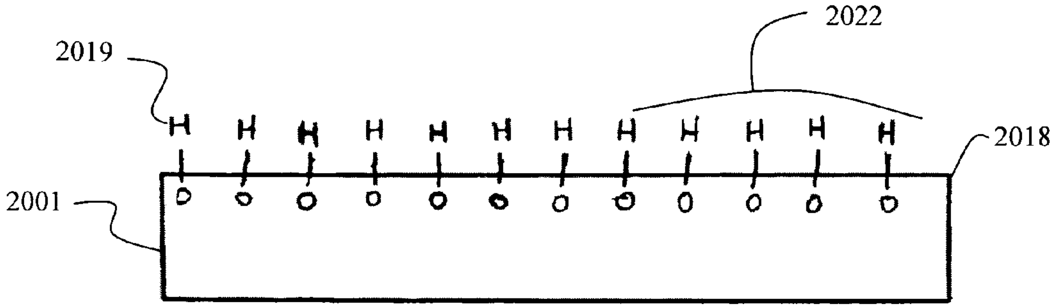
FIG. 25 is a sketch of a substrate with embedded hydroxyls according to some embodiments of the present invention.

FIG. 25 illustrates a dehydrated substrate 2018 according to some embodiments of the present invention. Hydroxyls 2019 are seen embedded in the substrate 2001. A representative portion 2022 of the surface of the substrate is consistent. The dehydration step after the rehydration step above may involve reducing the pressure in the process chamber back down to 1 Torr after rehydration. In cases wherein more complete dehydration is sought, cycles involving flooding the chamber with heated inert gas, which heats the substrate, and then drawing vacuum (as described previously), will dehydrate the substrate.

Figure 26:
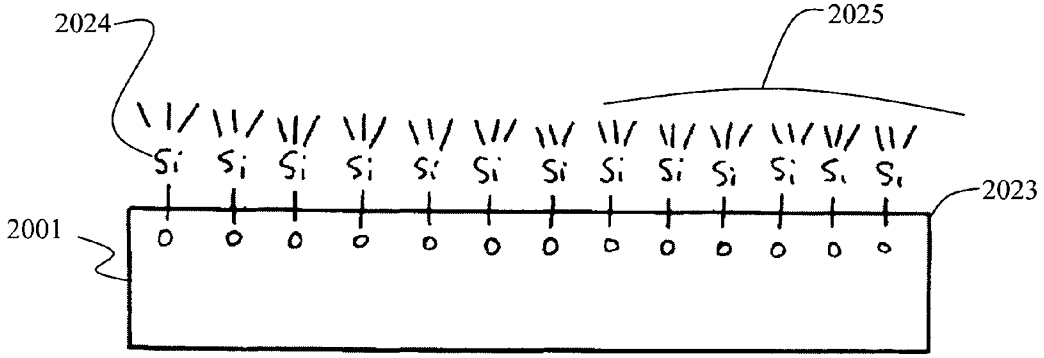
FIG. 26 is a sketch of a substrate with a consistent silane layer according to some embodiments of the present invention.

FIG. 26 illustrates a coated substrate 2023 according to some embodiments of the present invention. A silane based molecule 2024 is seen anchored to the substrate 2001 by having supplanted the hydrogen of an embedded hydroxyl. A portion 2025 of the layer shows a consistent, even, well anchored layer across the surface.

The steps of the process described above may be performed in a single process chamber in some embodiments. The chamber may be adapted to receive and to process a plurality of silicon wafer, or other substrates, and to perform all of the steps without ever opening up the chamber to the ambient environment.

As evident from the above description, a wide variety of embodiments may be configured from the description given herein and additional advantages and modifications will readily occur to those skilled in the art. The invention in its broader aspects is, therefore, not limited to the specific details, representative apparatus and illustrative examples shown and described. Accordingly, departures from such details may be made without departing from the spirit or scope of the applicant's general invention.

We claim:

1. A process for coating of substrates comprising the steps of:

inserting a substrate into a first process chamber;

plasma cleaning said substrate in said first process chamber;

rehydrating said substrate in said first process chamber after said step of plasma cleaning;

dehydrating said substrate in said first process chamber after said step of said rehydrating, thereby removing all surface moisture from said substrate; and pre-determining a first specific volume of liquid silane to be used for the process;

withdrawing said first specific volume of liquid silane from a first chemical reservoir;

supplying the first specific volume of liquid silane to a first heated vaporization chamber, said first heated vaporization chamber fluidically coupled to and fluidically isolatable from said first process chamber;

vaporizing said first specific volume of liquid silane; and supplying some of the vapor of said first specific volume of liquid silane to said first process chamber, thereby coating said substrate.

2. A process for coating of substrates comprising the steps of:

inserting a substrate into a first process chamber;

plasma cleaning said substrate in said first process chamber;

rehydrating said substrate in said first -process chamber after said step of plasma cleaning;

dehydrating said substrate in said first process chamber after said step of said rehydrating, thereby removing surface moisture from said substrate;

wherein the step of dehydrating said substrate comprises the steps of:

flooding said first process chamber with heated inert gas; and evacuating said first process chamber; and pre-determining a first specific volume of liquid silane to be used for the process;

withdrawing said first specific volume of liquid silane from a first chemical reservoir;

supplying the first specific volume of liquid silane to a first heated vaporization chamber, said first heated vaporization chamber fluidically coupled to and fluidically isolatable from said first process chamber;

vaporizing said first specific volume of liquid silane; and supplying some of the vapor of said first specific volume of liquid silane to said first process chamber, thereby coating said substrate.

3. The process of claim 2 wherein said silane is an amino silane.

4. The process of claim 2 wherein said silane is an epoxy silane.

5. The process of claim 2 wherein said silane is a mercapto silane.

6. The process of claim 1 wherein the step of dehydrating said substrate comprises the steps of:

flooding said first process chamber with heated inert gas; and evacuating said first process chamber.

7. The process of claim 2 wherein the step of rehydrating said substrate comprises supplying water to a second vaporization chamber that is fluidically coupled to said first process chamber.

8. A process for coating of substrates comprising the steps of:

inserting a substrate into a first process chamber;

plasma cleaning said substrate in said first process chamber;

rehydrating said substrate after said step of plasma cleaning said substrate;

dehydrating said substrate after said step of rehydrating said substrate, wherein the step of dehydrating said substrate comprises:

flooding said first process chamber with a heated inert gas; and evacuating said first process chamber;

pre-heating a vaporization chamber to a first temperature with a vaporization chamber heater;

pre-determining a first volume of liquid silane to be used for the process;

pre-determining a first amount of time to be used for the process;

supplying the first volume of liquid silane to the heated vaporization chamber, wherein said heated vaporization chamber is fluidically coupled to said process chamber by a passage open continuously while said first volume of liquid silane is supplied to said heated vaporization chamber; and vaporizing said first volume of said liquid silane, wherein the vapor of said liquid silane enters said process chamber through the open passageway, whereby the vapor of said liquid silane reacts with the substrate to create a layer;

allowing the vapor of said liquid silane to remain in the process chamber for the first pre-determined amount of time, wherein said heated vaporization chamber is fluidically coupled to said process chamber by a passage open continuously during said first pre-determined amount of time, and wherein said process chamber is not evacuated during said first pre-determined amount of time.

9. The process of claim 8 wherein the step of rehydrating said substrate comprises supplying water to a second vaporization chamber that is fluidically coupled to said first process chamber.

* * * * *